United States Patent
Cope et al.

(10) Patent No.: US 10,256,777 B2
(45) Date of Patent: Apr. 9, 2019

(54) AUDIO AMPLIFIERS

(71) Applicant: QUALCOMM Incorporated, San Diego, CA (US)

(72) Inventors: William Cope, Maricopa, AZ (US); Julian Aschieri, Phoenix, AZ (US); Tomer Saraf, Tempe, AZ (US)

(73) Assignee: QUALCOMM Incorporated, San Diego, CA (US)

(*) Notice: Subject to any disclaimer, the term of this patent is extended or adjusted under 35 U.S.C. 154(b) by 3 days.

(21) Appl. No.: 15/443,889

(22) Filed: Feb. 27, 2017

(65) Prior Publication Data

US 2017/0250662 A1    Aug. 31, 2017

Related U.S. Application Data

(60) Provisional application No. 62/301,513, filed on Feb. 29, 2016, provisional application No. 62/301,539, (Continued)

(51) Int. Cl.
*H03F 3/217* (2006.01)
*H03F 3/187* (2006.01)
(Continued)

(52) U.S. Cl.
CPC ............ *H03F 3/187* (2013.01); *H03F 1/523* (2013.01); *H03F 3/185* (2013.01); *H03F 3/2173* (2013.01);
(Continued)

(58) Field of Classification Search
CPC .......... H03F 3/185; H03F 3/2173; H03F 1/04; H03F 1/34; H03F 3/217; H03F 3/2171;
(Continued)

(56) References Cited

U.S. PATENT DOCUMENTS 5,633,940 A    5/1997    Wassink
5,982,160 A    11/1999   Walters et al.
(Continued)

FOREIGN PATENT DOCUMENTS

CN    1812256 A    8/2006
CN    202385058 U    8/2012
GB    2282016 A    3/1995

OTHER PUBLICATIONS

Dondon P., et al., "An Original Approach for the Design of a Class D Power Switching Amplifier—An Audio Application," IEEE, Electronics Circuits and Systems, vol. 1, Sep. 1999, pp. 161-164.

*Primary Examiner* — Khanh V Nguyen
(74) *Attorney, Agent, or Firm* — Patterson & Sheridan, L.L.P.

(57) ABSTRACT

Certain aspects of the present disclosure provide amplifiers. Certain aspects of the present disclosure provide methods and apparatus for protecting an such amplifiers, for example an audio amplifier, or a delta-sigma modulator from saturation. One example amplifier generally includes an output stage comprising a plurality of transistors; and a feedback network having an input coupled to an output of the output stage and comprising a plurality of integrators connected in series. At least one of the plurality of integrators generally includes an operational amplifier having an input and an output, a first resistive element coupled to the input of the operational amplifier, a capacitive element coupled between the input and the output of the operational amplifier; and a first switch coupled between the input and the output of the operational amplifier. For certain aspects, the amplifier may be a class-D amplifier or a direct digital feedback amplifier (DDFA).

27 Claims, 18 Drawing Sheets

Related U.S. Application Data filed on Feb. 29, 2016, provisional application No. 62/301,528, filed on Feb. 29, 2016, provisional application No. 62/301,578, filed on Feb. 29, 2016.

(51) Int. Cl.
  *H03F 1/52* (2006.01)
  *H03F 3/185* (2006.01)
  *H03F 3/45* (2006.01)
  *H03M 3/00* (2006.01)

(52) U.S. Cl.
  CPC .......... *H03F 3/45475* (2013.01); *H03M 3/49* (2013.01); *H03M 3/492* (2013.01); *H03F 2200/03* (2013.01); *H03F 2200/331* (2013.01); *H03F 2200/426* (2013.01); *H03F 2200/78* (2013.01); *H03F 2203/45514* (2013.01)

(58) Field of Classification Search
  CPC ......... H03F 2200/351; H03F 2200/432; H03F 2200/78; H03F 3/187; H03F 1/523; H03F 3/45; H03K 17/165
  USPC ........................................ 330/10, 207 A, 251
  See application file for complete search history.

(56) References Cited

U.S. PATENT DOCUMENTS

| | | | |
|---|---|---|---|
| 6,127,814 | A | 10/2000 | Goder |
| 6,294,954 | B1 | 9/2001 | Melanson |
| 6,373,334 | B1* | 4/2002 | Melanson ............. H03F 3/2175 330/10 |
| 6,552,606 | B1 | 4/2003 | Veltman et al. |
| 6,933,871 | B2 | 8/2005 | Melanson et al. |
| 7,265,617 | B2 | 9/2007 | Ohkuri |
| 7,276,963 | B2* | 10/2007 | Wegner ................. H03F 3/217 330/10 |
| 7,312,654 | B2* | 12/2007 | Roeckner ............... H03F 1/305 330/10 |
| 7,362,254 | B2* | 4/2008 | Kost ....................... H03F 3/217 330/10 |
| 7,365,668 | B2* | 4/2008 | Mitteregger ........ H03F 3/45183 327/552 |
| 7,498,784 | B2 | 3/2009 | Gokita et al. |
| 7,538,607 | B2* | 5/2009 | Morishima ............. H03F 3/217 330/10 |
| 7,554,390 | B1* | 6/2009 | Shankar .................. H03F 3/217 330/10 |
| 7,554,409 | B1 | 6/2009 | Zhang et al. |
| 7,570,118 | B1 | 8/2009 | Gaboriau et al. |
| 7,612,608 | B2* | 11/2009 | Kozak ....................... H03F 1/32 330/10 |
| 7,671,774 | B2* | 3/2010 | Braswell ............... H03M 3/362 341/143 |
| 7,705,673 | B2 | 4/2010 | Teng et al. |
| 7,714,675 | B2 | 5/2010 | Wang |
| 7,773,358 | B2 | 8/2010 | Neesgaard et al. |
| 7,920,082 | B2 | 4/2011 | Kawai et al. |
| 8,054,130 | B2 | 11/2011 | Rabary et al. |
| 8,299,853 | B2 | 10/2012 | Maejima |
| 8,390,374 | B2* | 3/2013 | Alexander .......... H03F 3/45475 330/147 |
| 8,884,795 | B2 | 11/2014 | Takaike et al. |
| 8,942,937 | B2* | 1/2015 | Miyamoto ............. G06F 3/044 324/686 |
| 9,077,295 | B2 | 7/2015 | Ozaki |
| 9,083,283 | B2 | 7/2015 | Sugawara et al. |
| 9,628,040 | B2* | 4/2017 | Lesso ......................... H03F 1/34 |
| 9,680,496 | B2* | 6/2017 | Kauffman ............. H03M 3/356 |
| 9,985,594 | B2* | 5/2018 | Quilligan ................ H03F 3/387 |
| 2005/0135036 | A1 | 6/2005 | Kanamori et al. |
| 2012/0075132 | A1* | 3/2012 | Lai ........................... H03M 3/38 341/143 |
| 2014/0240153 | A1 | 8/2014 | Das |
| 2015/0222190 | A1 | 8/2015 | Yim |
| 2015/0288335 | A1 | 10/2015 | Høyerby et al. |
| 2017/0250654 | A1 | 8/2017 | Cope |
| 2017/0250655 | A1 | 8/2017 | Cope et al. |

* cited by examiner

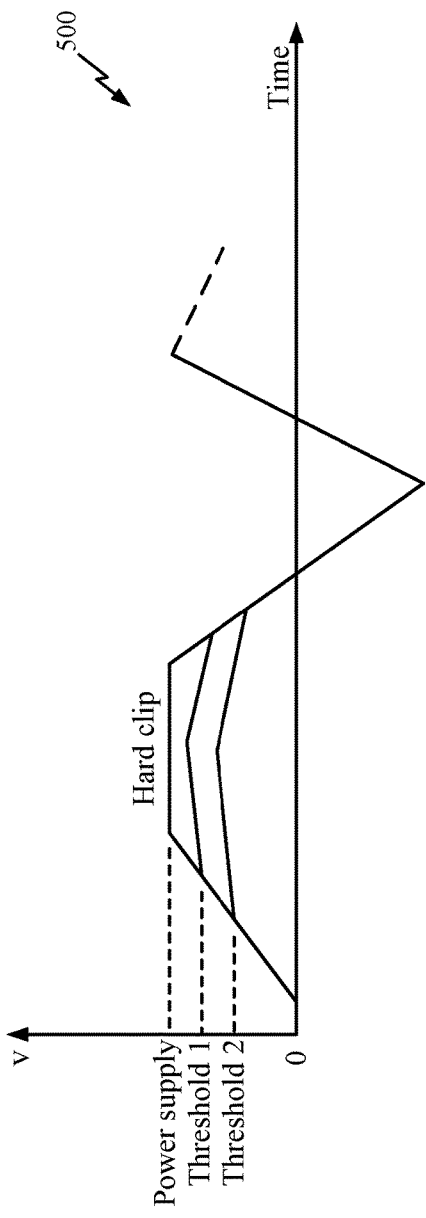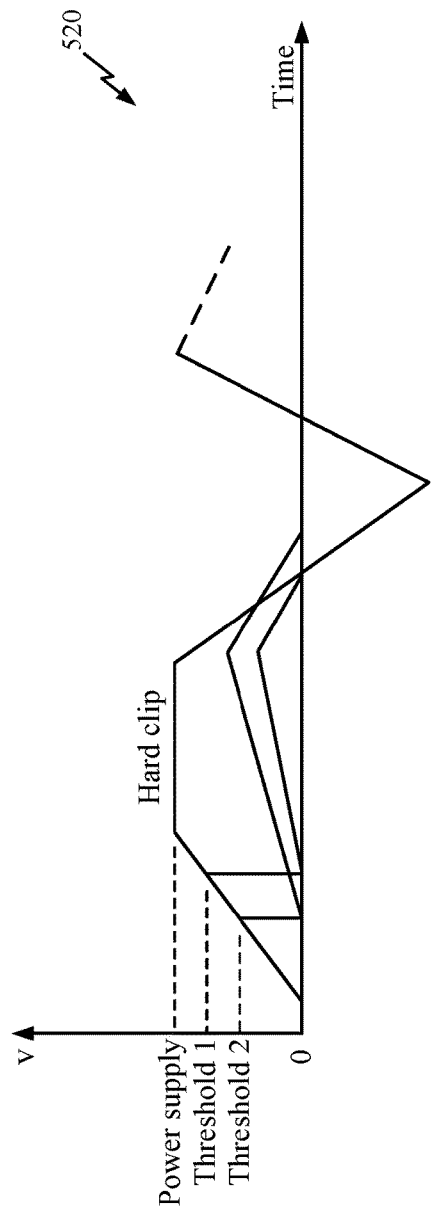
FIG. 5A
FIG. 5B

AD Modulation

BD Modulation

AUDIO AMPLIFIERS

CLAIM OF PRIORITY UNDER 35 U.S.C. § 119

The present application claims the benefit of U.S. Provisional Application Ser. No. 62/301,513, entitled "PERFORMANCE PROTECTION OF AUDIO POWER AMPLIFIER (PA) DURING HIGH MODULATION" and filed Feb. 29, 2016, of U.S. Provisional Application Ser. No. 62/301,539, entitled "DIRECT DIGITAL FEEDBACK AMPLIFIER" and filed Feb. 29, 2016, of U.S. Provisional Application Ser. No. 62/301,528, entitled "SIGNAL-PROCESSING-BASED PROTECTION OF A CLASS-D PULSE-WIDTH MODULATED POWER AMPLIFIER (PA)" and filed Feb. 29, 2016, and of U.S. Provisional Application Ser. No. 62/301,578, entitled "HIGH AMPLITUDE PERFORMANCE IN DELTA-SIGMA MODULATOR" and filed Feb. 29, 2016, which are all assigned to the assignee of the present application and expressly incorporated by reference herein in their entireties.

TECHNICAL FIELD

Certain aspects of the present disclosure generally relate to electronic circuits and, more particularly, to an audio amplifier, a delta-sigma modulator, or an audio amplifier comprising a delta-sigma modulator.

BACKGROUND

Various electronic systems are capable of processing digital audio signals and amplifying the processed signals to drive a speaker, thereby producing sound waves. Examples of such systems include portable media player devices, cellular telephones, smartphones, tablets, computers, radios, audio recorders, stereo equipment (e.g., audio receivers), components in a vehicle, and the like. For digital audio processing, an encoder-decoder (CODEC) may be used to convert analog audio signals to encoded digital signals and vice versa. For example, a CODEC may receive an analog audio signal (e.g., from a microphone), and convert the analog audio signal into a digital signal that can be processed (e.g., digitally filtered) via a digital signal processor (DSP). The CODEC can then convert the processed digital output of the DSP to an analog signal for use by audio speakers, for example, via a digital-to-analog converter (DAC).

Amplification of digital or analog audio signals may be performed using any of various suitable techniques. Class-D amplifiers are widely used in audio applications because these types of amplifiers may be more efficient than class-AB amplifiers and involve less heat management and external components (e.g., heatsinks). A class-D amplifier generally refers to an electronic amplifier in which the transistors in the output stage operate as electronic switches, instead of as linear gain devices, as in other amplifier types. In a class-D amplifier, the signal to be amplified is a train of pulses of constant amplitude, but varying width and separation (e.g., different duty cycle), so the output stage transistors switch rapidly back and forth between fully conductive and nonconductive states. Before being applied to the amplifier, the signal to be amplified is converted to a pulse train using pulse width modulation, pulse density modulation, or other suitable techniques. The amplified pulse train output by the transistors can be converted back to an analog audio signal by low-pass filtering the pulse train to remove the unwanted high-frequency components introduced by pulse modulation and recover the desired low-frequency signal.

Despite their benefits, class-D amplifiers may have some drawbacks, such as lower linearity and/or lower power supply rejection ratio (PSRR) in certain aspects when compared to other amplifier implementations. In order to improve the overall performance of class-D amplifiers, feedback can be applied around the output power stage. This feedback may increase the linearity of the class-D output stage and may attenuate power supply ripple present in the audio band (e.g., intermodulation products between the main signal and the power supply tones).

SUMMARY

Certain aspects of the present disclosure generally relate to an amplifier or a delta-sigma modulator.

Certain aspects of the present disclosure provide an amplifier. The amplifier generally includes an output stage configured to generate an amplified signal, wherein the output stage is driven based on an input signal, a feedback network connected with the output stage and comprising a delta-sigma modulator with a plurality of integrators and an analog-to-digital converter (ADC), and logic. The logic is configured to monitor at least one of the input signal, an output of the ADC, or one or more outputs of the integrators to detect a triggering event; and to reset at least one of the integrators if the triggering event is detected.

Certain aspects of the present disclosure provide an amplifier. The amplifier generally includes an output stage comprising a plurality of transistors; and a feedback network having an input coupled to an output of the output stage and comprising a plurality of integrators connected in series. At least one of the plurality of integrators generally includes an operational amplifier having an input and an output, a first resistive element coupled to the input of the operational amplifier, a capacitive element coupled between the input and the output of the operational amplifier; and a first switch coupled between the input and the output of the operational amplifier.

Certain aspects of the present disclosure provide a method for operating an amplifier comprising a plurality of integrators and an analog-to-digital converter (ADC). The method generally includes generating an amplified signal in the amplifier based on an input signal; monitoring at least one of the input signal, an output of the ADC, or one or more outputs of the integrators to detect a triggering event; and resetting at least one of the integrators if the triggering event is detected.

Certain aspects of the present disclosure provide a method for operating an amplifier. The method generally includes generating an amplified signal in the amplifier based on an input signal, wherein the amplifier has a feedback network comprising a delta-sigma modulator with a plurality of integrators and an ADC; monitoring at least one of the input signal, an output of the ADC, or one or more outputs of the integrators to detect a triggering event; and resetting at least one of the integrators if the triggering event is detected.

Certain aspects of the present disclosure provide a method for operating an amplifier comprising a plurality of integrators. The method generally includes generating an amplified signal in the amplifier based on an input signal; monitoring one or more of the input signal, an output of an ADC of the amplifier, and one or more outputs of the integrators to detect a triggering event; and resetting a subset of the plurality of integrators if the triggering event is detected.

Certain aspects of the present disclosure generally relate to a direct digital feedback amplifier (DDFA).

Certain aspects of the present disclosure provide an amplifier. The amplifier generally includes a pulse-width modulator, a first output stage, and a second output stage. The pulse-width modulator is configured to pulse-width modulate a digital input signal and to invert the pulse-width modulated signal. The first output stage is configured to generate a first amplified signal of a differential pair for applying to a load, wherein the first output stage is driven based on the pulse-width modulated signal. The second output stage is configured to generate a second amplified signal of the differential pair for applying to the load, wherein the second output stage is driven based on the inverted signal.

Certain aspects of the present disclosure provide an amplifier. The amplifier generally includes a pulse-width modulator, a first output stage, and a second output stage. The pulse-width modulator is configured to pulse-width modulate a digital input signal, to invert the digital input signal, and to pulse-width modulate the inverted input signal. The first output stage is configured to generate a first amplified signal of a differential pair for applying to a load, wherein the first output stage is driven based on the pulse-width modulated input signal. The second output stage is configured to generate a second amplified signal of the differential pair for applying to the load, wherein the second output stage is driven based on the pulse-width modulated inverted signal.

Certain aspects of the present disclosure provide a method of operating an amplifier. The method generally includes pulse-width modulating an input signal; inverting the pulse-width modulated signal; driving a first output stage based on the pulse-width modulated signal, the first output stage being configured to generate a first amplified signal of a differential pair for applying to a load; and driving a second output stage based on the inverted signal, the second output stage being configured to generate a second amplified signal of the differential pair for applying to the load.

Certain aspects of the present disclosure provide a method of operating an amplifier. The method generally includes pulse-width modulating an input signal; inverting the input signal; pulse-width modulating the inverted input signal; driving a first output stage based on the pulse-width modulated input signal, the first output stage being configured to generate a first amplified signal of a differential pair for applying to a load; and driving a second output stage based on the pulse-width modulated inverted signal, the second output stage being configured to generate a second amplified signal of the differential pair for applying to the load.

Certain aspects of the present disclosure generally relate to signal-processing-based protection of class-D pulse-width modulated power amplifiers (PAs).

Certain aspects of the present disclosure provide an amplifier. The amplifier generally includes an output stage configured to generate an amplified signal; a feedback network connected with the output stage and configured to generate a feedback signal, based on the amplified signal, for comparison with an input signal for the amplifier; and a protection circuit connected with the feedback network and configured to detect a change in a parameter of the feedback network indicative of a short occurring in a circuit comprising the amplifier and to control powering off at least a portion of the amplifier based on the detected change.

Certain aspects of the present disclosure provide a method of protecting an amplifier having a feedback network. The method generally includes detecting a change in a parameter of the feedback network indicative of a short occurring in a circuit comprising the amplifier and powering off at least a portion of the amplifier based on the detected change.

Certain aspects of the present disclosure generally relate to preventing instability when inputting a high amplitude signal into a delta-sigma modulator, such as in an amplifier with a delta-sigma modulator and a feedback network. Certain aspects may be particularly suited for a high amplitude digital signal input into a digital delta-sigma modulator.

Certain aspects of the present disclosure provide an amplifier. The amplifier generally includes an output stage configured to generate an amplified signal, wherein the output stage is driven based on an input signal and a delta-sigma modulator comprising a plurality of integrators. The delta-sigma modulator is configured to determine that the input signal has a signal level above a first threshold and to modulate coefficients of the integrators based on the determination.

Certain aspects of the present disclosure provide a method for operating an amplifier. The method generally includes determining that an input signal has a signal level above a first threshold, modulating coefficients of integrators in a delta-sigma modulator based on the determination, and generating an amplified signal in the amplifier based on the input signal and an output of the delta-sigma modulator.

Certain aspects of the present disclosure provide an apparatus. The apparatus generally includes a digital delta-sigma modulator comprising a plurality of integrators and configured to determine that the digital input signal has a signal level above a first threshold and to modulate coefficients of the integrators based on the determination.

Certain aspects of the present disclosure provide a method of operating an amplifier comprising a plurality of integrators and an ADC. The method generally includes generating an amplified signal in the amplifier based on an input signal; and resetting at least one of the integrators based on a variation in at least one of the input signal, an output of the ADC, or one or more outputs of the integrators.

Certain aspects of the present disclosure provide an amplifier. The amplifier includes an integrator comprising at least three integrator stages coupled in series and control circuitry coupled to the integrator. The control circuitry is generally configured to maintain a mode of a first or a last integrator stage of the at least three integrator stages and to modify a mode of at least one intermediate integrator stage of the at least three integrator stages while maintaining the mode of the first or the last integrator stage.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 5A is a graph of an example soft reset of an analog integrator with performance protection circuitry, in accordance with certain aspects of the present disclosure.

FIG. 5B is a graph of an example hard reset of an analog integrator with performance protection circuitry, in accordance with certain aspects of the present disclosure.

DETAILED DESCRIPTION

Certain aspects of the present disclosure generally relate to saturation protection of an audio amplifier. Certain aspects of the present disclosure generally relate to a direct digital feedback amplifier (DDFA) and methods provided as digital processing features of the DDFA. Certain aspects of the present disclosure generally relate to protecting an amplifier having a feedback network by detecting a change in a parameter of the feedback network indicative of a short occurring in a circuit comprising the amplifier and powering off at least a portion of the amplifier based on the detected change. Certain aspects of the present disclosure generally relate to preventing instability when operating a delta-sigma modulator with a high amplitude input signal, such as in an amplifier with a feedback network (e.g., a DDFA).

Various aspects of the present disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Example Class-D Amplifier

Figure 1A:
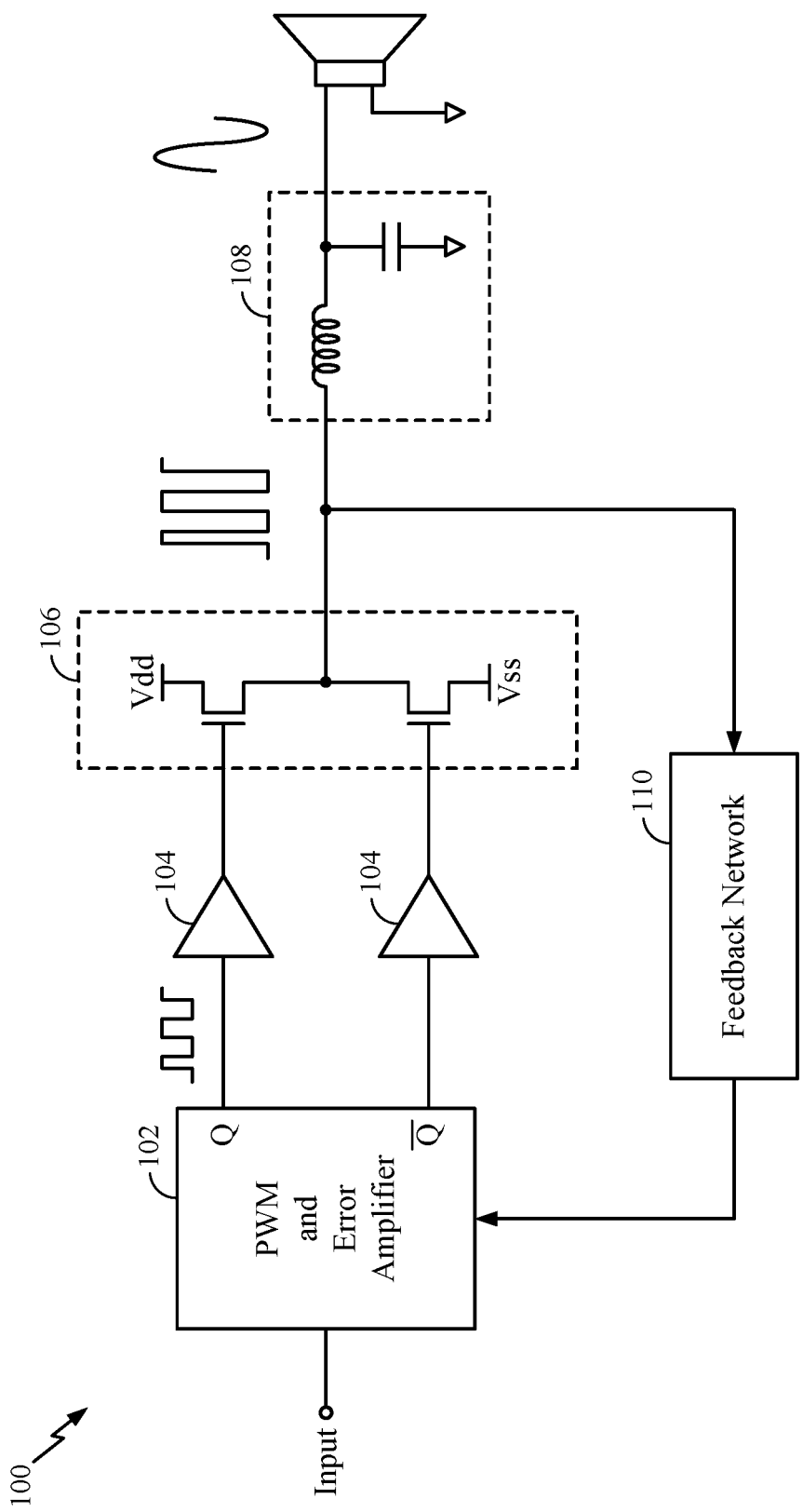
FIG. 1A is a block diagram of an example class-D amplifier with feedback in a single-ended (SE) configuration, in accordance with certain aspects of the present disclosure.

FIG. 1A is a block diagram of an example class-D amplifier 100 in a single-ended (SE) configuration (also known as a half-bridge topology), in accordance with certain aspects of the present disclosure. The class-D amplifier 100 may include a pulse width modulator (PWM) and error amplifier stage 102, drivers 104, an output stage 106, a low-pass filter (LPF) 108, and a feedback network 110. The output of the class-D amplifier 100 may be used to drive a load (e.g., a speaker 112, as illustrated). The input signal (e.g., an audio signal) to be amplified may be encoded into a train of square pulses of constant amplitude using pulse width modulation in the PWM and error amplifier stage 102. For certain aspects, the pulse train may be generated by comparing the input signal with a high frequency triangle waveform, where the triangle waveform defines both the input amplitude for full modulation and the switching frequency. The PWM and error amplifier stage 102 outputs the pulse train signal (on Q) and its inverse (on Q_bar) to the drivers 104.

The drivers 104 are configured to produce high current signals to charge and discharge the output stage capacitance (e.g., the gate capacitance if the output stage comprises field-effect transistors (FETs)) during the switching interval to ensure fast rise/fall times of the transistors in the output stage 106. The drivers 104 may be implemented with any of various suitable topologies, such as using inverter/level shifters. The transistors in the output stage 106 may be configured with a push-pull topology, as illustrated. The output stage 106 may include FETs, which may include, for example: (1) two n-channel metal-oxide semiconductor (NMOS) transistors or (2) one p-channel metal-oxide semiconductor (PMOS) transistor and one NMOS. In an SE configuration, the high-side transistor may be connected to a positive supply voltage (Vdd), and the low-side transistor may be connected to a negative supply voltage (Vss), as shown.

With the alternate switching of the transistors between the power supply voltages, as controlled by the drivers based on the pulse train signal (Q) and its inverse (Q_bar), the output signal from the output stage 106 is an amplified version of the pulse train. The LPF 108 filters the signal output by the output stage 106 to remove the high-frequency components introduced by the modulation and recover the desired signal. For certain aspects, the LPF 108 may be implemented with a series inductor and a shunt capacitor, as illustrated. The filtered signal output from the LPF 108 may be used to drive the load (e.g., the speaker 112 in the case of audio amplifiers).

The introduction of dead time between deactivation of the high-side transistor and activation of the low-side transistor (or vice versa)—for example, to prevent shoot-through current between the power supply rails if both transistors were on concurrently—may lead to nonlinear output impedance. Furthermore, the LPF 108 has a highly load-dependent frequency response in many implementations. These sources of errors may be mitigated in some implementations with negative feedback, which is implemented with the feedback network 110 connected between the output of the output stage 106 and an error amplifier in the PWM and error amplifier stage 102. The feedback network 110 may include a voltage divider and one or more integrators, for example, to effectively back out the effects of amplification and modulation and produce an error-inclusive signal that can be compared to the desired (audio) input signal.

Figure 1B:
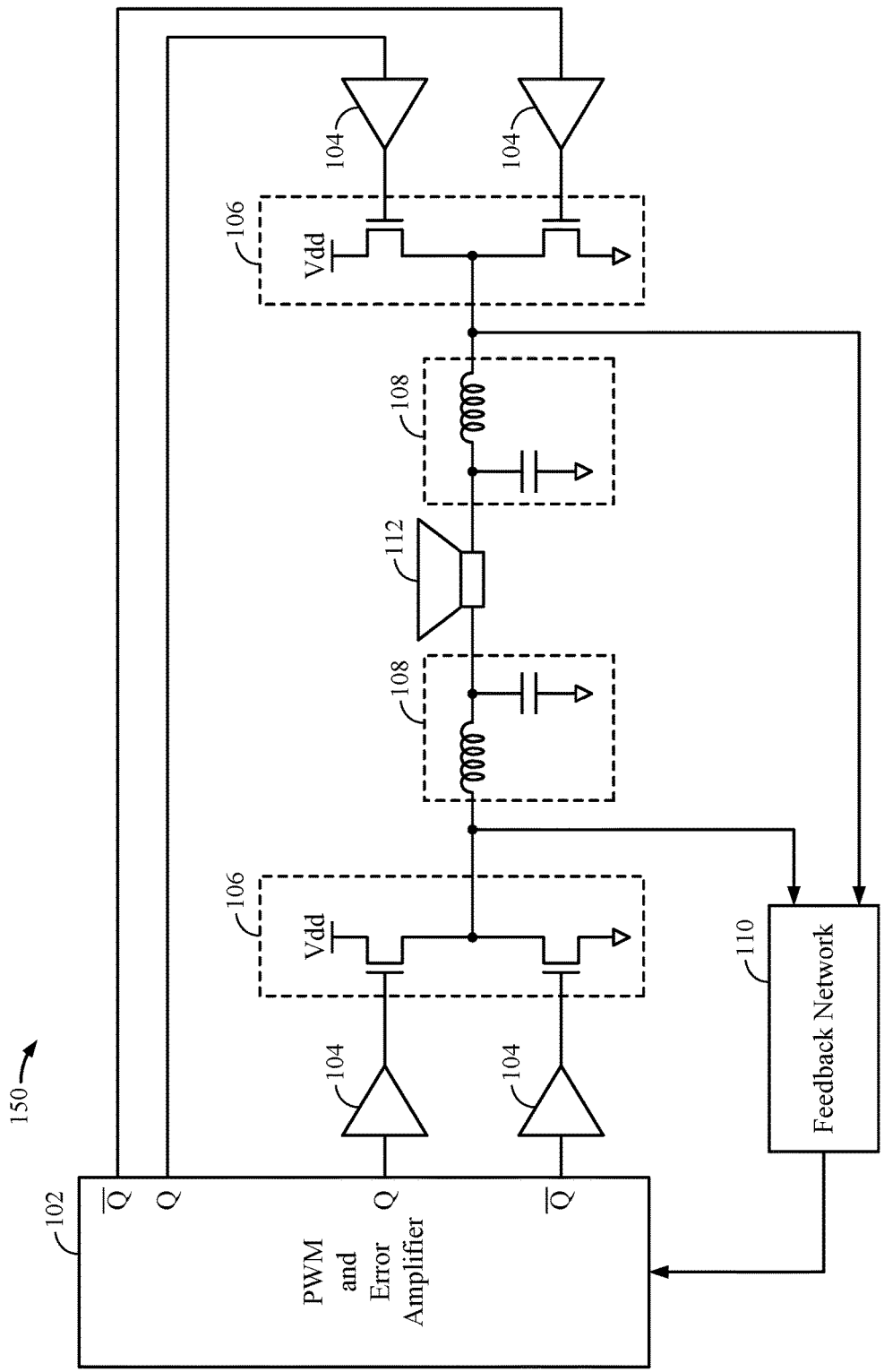
FIG. 1B is a block diagram of an example class-D amplifier with feedback in a bridge-tied load (BTL) configuration, in accordance with certain aspects of the present disclosure.

FIG. 1B is a block diagram of an example class-D amplifier 150 in a bridge-tied load (BTL) configuration (also known as a full-bridge topology), in accordance with certain aspects of the present disclosure. The BTL configuration includes two output stages 106 whose outputs are filtered by two LPFs 108, and the filtered signals differentially drive the load (e.g., the speaker 112). The transistors of the two output stages 106 are driven by four drivers 104, which are controlled by four output pulse trains from the PWM and error amplifier stage 102, as shown. The feedback network 110 may also receive inputs from the outputs of both output stages 106.

Example Direct Digital Feedback Amplifier

Figure 2A:
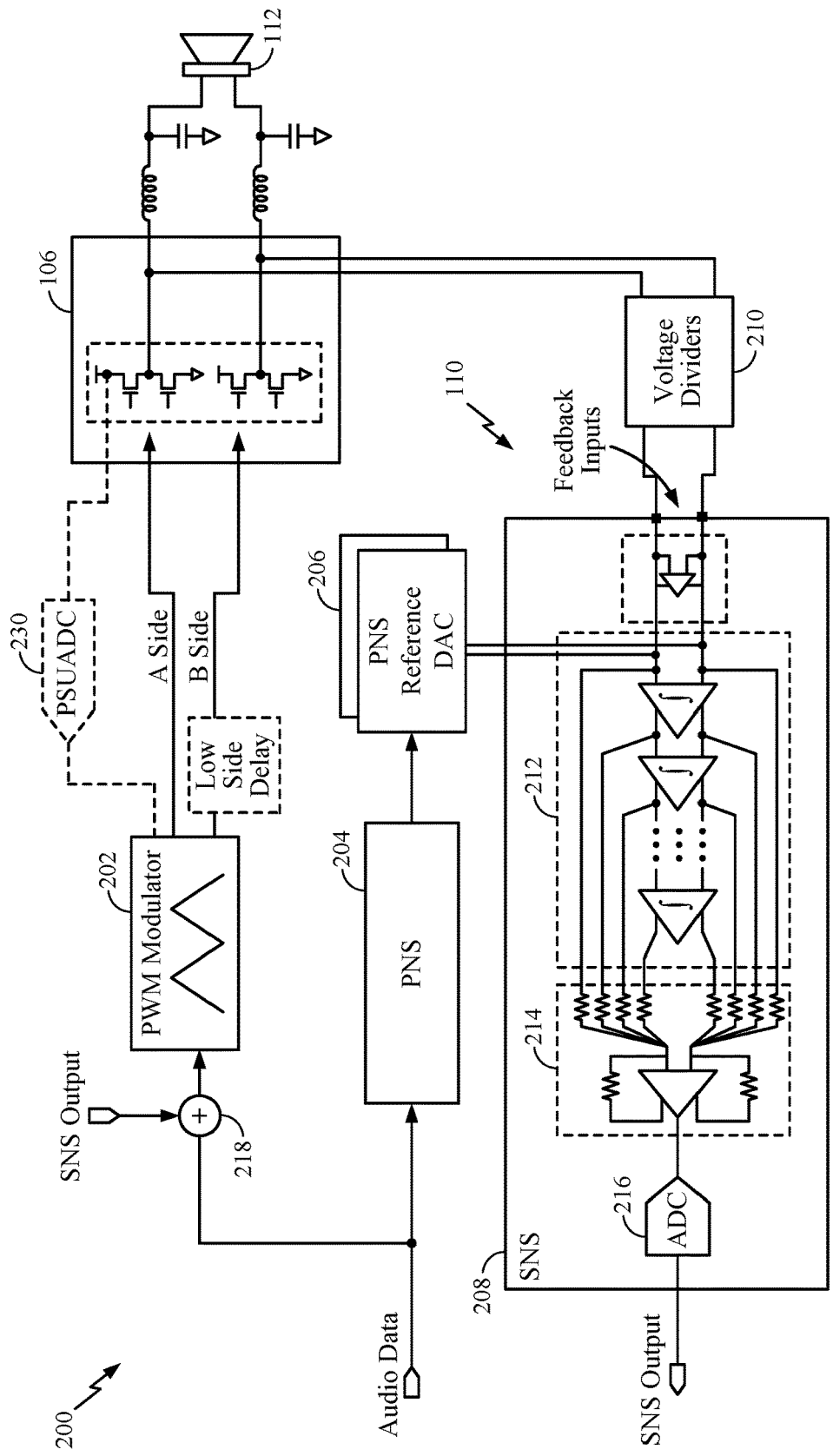
FIG. 2A is a block diagram of an example direct digital feedback amplifier (DDFA) for a BTL configuration, in accordance with certain aspects of the present disclosure.

FIG. 2A is a block diagram of an example direct digital feedback amplifier (DDFA) 200, in accordance with certain aspects of the present disclosure. As used herein, a DDFA generally refers to an amplifier in which digital input signals can be directly modulated and used to drive an amplifier output stage, without first being converted to analog signals, and in which a feedback mechanism is used in an effort to correct for any amplification or modulation errors. Although the DDFA 200 in FIG. 2A is illustrated for a BTL configuration (similar to that described above for FIG. 1B), the DDFA may alternatively be configured for SE operation (similar to that described above for FIG. 1A).

The DDFA 200 may include a pulse width modulator 202, a primary noise shaper (PNS) 204, and a PNS reference digital-to-analog converter (DAC) 206. The PNS 204 may perform noise shaping, as part of the process of quantization, to increase the apparent signal-to-noise ratio (SNR) of the signal output to the PNS reference DAC 206. The feedback network 110 of the DDFA 200 may include a voltage divider stage 210 and a secondary noise shaper (SNS) 208, where the SNS 208 may include a series of integrators 212, a summation circuit 214, and an analog-to-digital converter (ADC) 216 (e.g., a flash ADC). The series of integrators 212 may include, for example, three, four, five, or more integrators connected in series. In some implementations, the SNS 208 includes a plurality of stages forming an integrator. The output of the SNS 208 may be combined with the digital (audio) input signal in a combiner 218 (e.g., a summer) to implement the feedback mechanism, and the pulse width modulator 202 may encode the combined signal using pulse width modulation. The PNS 204 may include a series of digital integrators for digitally implementing delta-sigma modulation on the digital (audio) input signal before the modulated signal is converted to an analog signal by the PNS reference DAC 206. The PNS 204 may also include a pulse width modulator to encode the delta-sigma modulated signal using pulse width modulation before conversion by the PNS reference DAC 206. The analog signal from the PNS reference DAC 206 is combined with the attenuated feedback signal from the voltage divider stage 210 in the SNS 208, and the SNS 208 performs analog delta-sigma modulation on the combined analog signal.

Example Saturation Protection

Figure 3A:
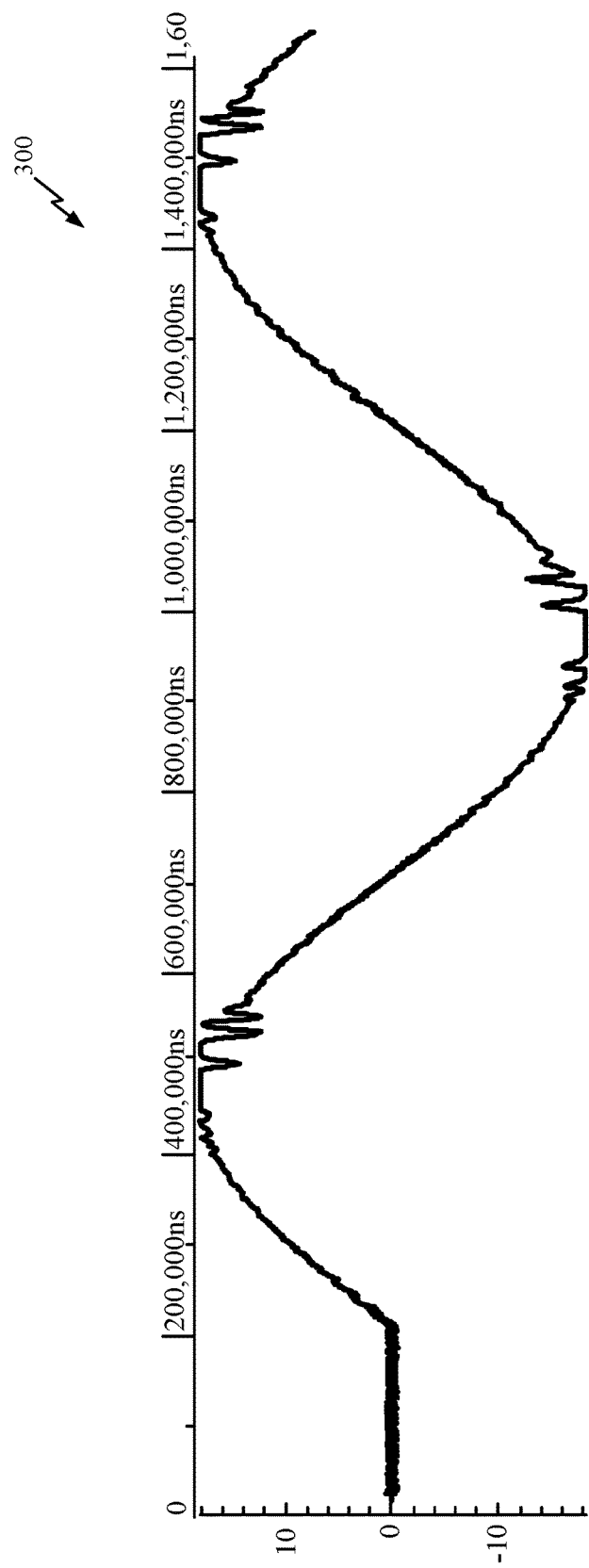
FIG. 3A illustrates an example audio output signal in an amplifier without performance protection.

Closed-loop power amplifiers (PAs) may be designed to have headroom in order to maintain performance specifications including high signal-to-noise ratio (SNR) and low distortion. When input signals exceed this headroom, performance can degrade rapidly, as well as make the amplifier unstable. Additionally, when transitioning out of a saturated state to an unsaturated state, the amplifier can become temporarily unstable as the system settles. This may be true for PWM output systems (e.g., the DDFA 200), for example, where quantization is large in amplitude and time. FIG. 3A is a waveform diagram 300 of an example audio output signal from an amplifier, illustrating the degradation in performance at the signal peaks.

Due to the nature of the analog integrators 212 in the SNS 208, an input signal may cause the integrators to saturate. For example, large delays in the output stage or large input signal magnitudes may cause this saturation of the integrators. When the integrators saturate, noise shaping degrades rapidly. Additionally, even if the analog integrators 212 are controlled properly, as the input signal falls to tolerable levels, settling within the integrators may cause errors seen at the load (e.g., the speaker 112).

Certain techniques and apparatus presented herein may maintain performance or increase the likelihood that performance of the amplifier is maintained when input signals exceed the headroom.

Certain aspects of the present disclosure monitor one or more ADCs in the feedback network 110 (e.g., the ADC 216 in the SNS 208), one or more integrators (e.g., analog integrators 212 in the SNS 208 and/or digital integrators in the PNS 204), and/or input levels (e.g., the amplitude of the digital audio input signal, labeled "Audio Data" in FIG. 2A). When the monitoring indicates a triggering event for protection (e.g., saturation of the integrators is detected or the input magnitude is greater than a programmable threshold), then at least some of the integrators 212 may be reset.

In order to prevent the entire loop from going unstable, multiple protection schemes may be implemented for certain aspects. To properly protect against multiple possible sources of error, the DDFA 200 may include an integrator saturation control module with several inputs. There are thus several sources to trigger the reset of the integrators, including: (1) analog integrator saturation comparator(s), (2) ADC undervoltage or overvoltage (UV/OV), and (3) a PNS threshold trigger. In the case of analog integrator saturation comparators, each analog integrator 212 may have a saturation detection comparator, which can trigger a reset. In the case of ADC UV/OV, when the summation circuit 214 and the ADC 216 become saturated (which may not involve the integrators 212 saturating), the ADC may output a UV or OV signal, which can trigger a reset at the integrator saturation control module. In the case of a PNS threshold trigger, when the audio input signal exceeds a programmable threshold, the PNS 204 may trigger a reset at the integrator saturation control module.

Figure 3B:
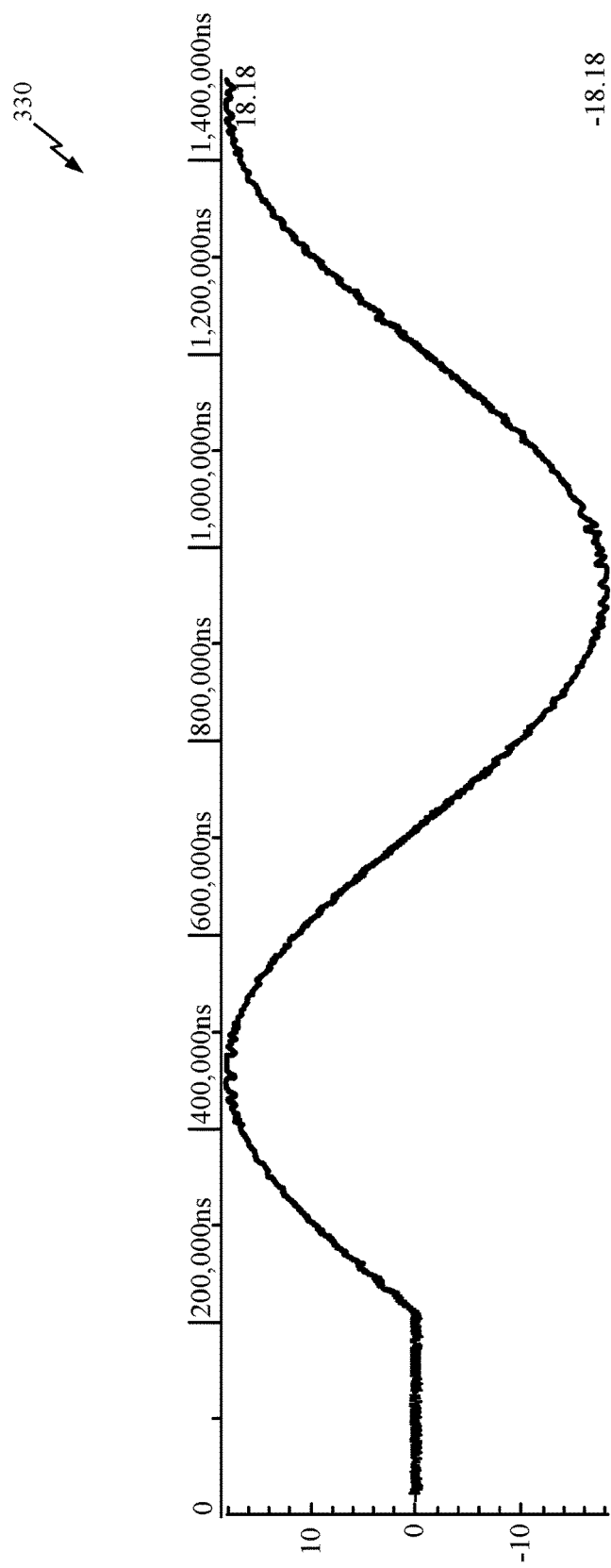
FIG. 3B illustrates an example audio output signal in an amplifier with performance protection, in accordance with certain aspects of the present disclosure.

By triggering a reset of the integrators, the performance of the amplifier may be protected. FIG. 3B is a waveform diagram 320 of the example audio output signal from the same amplifier as the signal in FIG. 3A, but with performance protection implemented, in accordance with certain aspects of the present disclosure.

Figure 4:
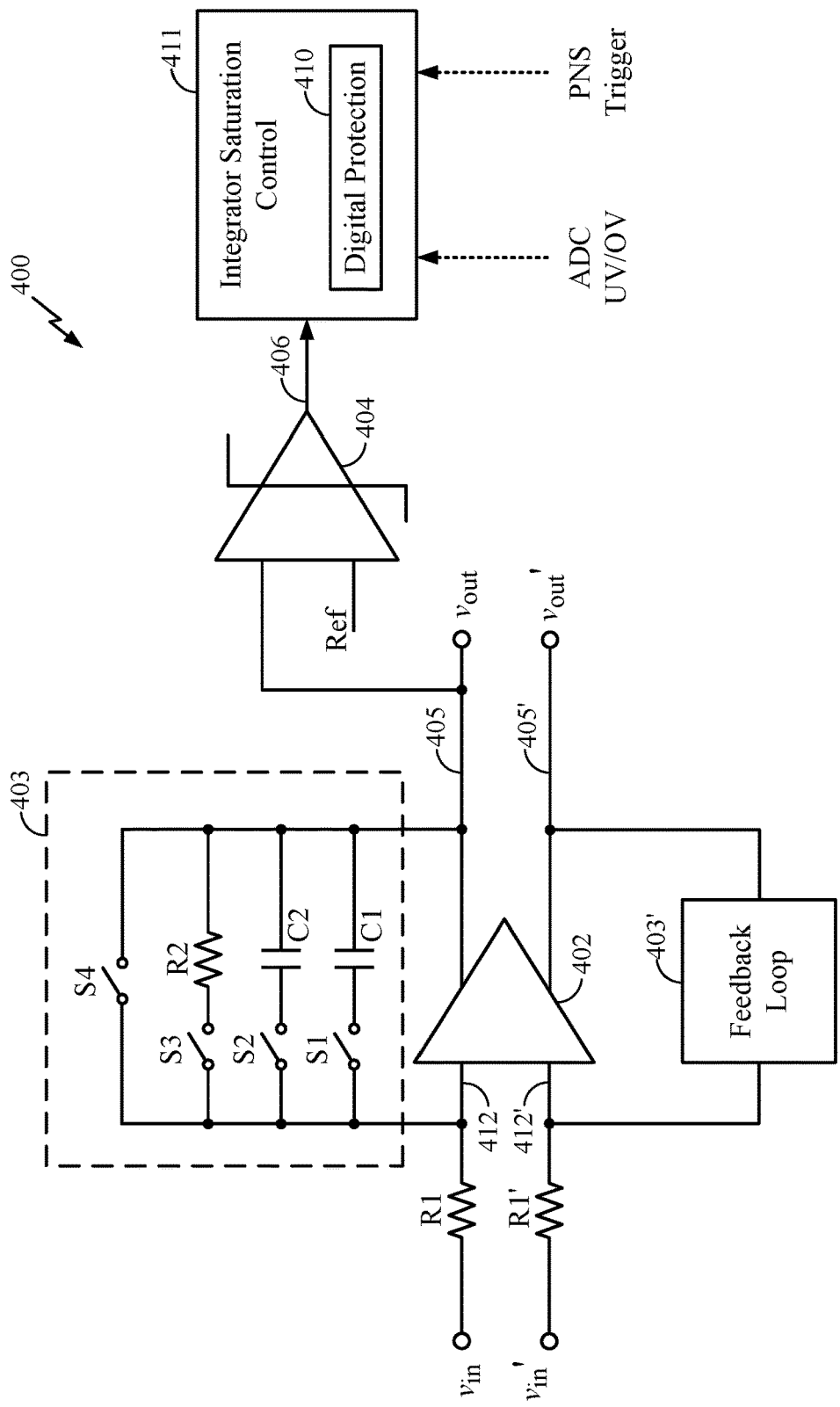
FIG. 4 is a circuit diagram of an example analog integrator with performance protection circuitry, in accordance with certain aspects of the present disclosure.

FIG. 4 is a circuit diagram 400 of an example analog integrator (e.g., any of the integrators 212 in the analog delta-sigma modulator of the SNS 208) with performance protection circuitry, in accordance with certain aspects of the present disclosure. The integrator may be implemented with an amplifier 402, one or more capacitors (e.g., capacitors C1 and C2) connected in a feedback loop 403 for the amplifier 402, and a resistor R1 connected to the feedback loop 403 and an input 412 to the amplifier 402. The capacitors C1 and C2 may be selectively connected in the feedback loop 403 via switches S1 and S2, respectively. For certain aspects, a resistor R2 may be selectively connected in parallel with either or both of the capacitors C1 and C2 via switch S3. A switch S4 may be selectively connected in parallel with either or both of the capacitors C1 and C2 and may selectively short an output node 405 of the integrator with the input 412 to the amplifier 402. The switches S1, S2, S3, and/or S4 may be implemented with transistors, for example. The integrator may be a differential integrator with another feedback loop 403' connected between another input 412' and another output node 405' of the amplifier 402. The other feedback loop 403' may have similar components as the feedback loop 403.

As shown in FIG. 4, the integrator (e.g., each integrator 212 in the SNS 208) may have a comparator 404 connected with the output node 405 of the integrator to compare the output signal with a predetermined threshold (labeled "Ref"). For other aspects, the comparator 404 may be connected with the other output node 405' of the integrator. In certain aspects, the threshold may be the same for all the integrators (e.g., the series of integrators 212), while in other aspects, at least one of the integrators may have a different threshold than the other integrators. If the output signal is greater than the threshold, the comparator 404 may output a trigger signal on line 406 to the digital protection circuit 410 (e.g., in the integrator saturation control module 411 of the DDFA 200). Based on the trigger signal and/or other signals received by the integrator saturation control module (e.g., the ADC UV/OV signal or the PNS threshold trigger described above), this and potentially other integrators (e.g., the series of integrators 212 in the SNS 208) may be reset. The performance protection circuitry (e.g., the digital protection circuit 410 or other logic in the integrator saturation control module 411) may output one or more control signals to reset this integrator and/or other integrators (e.g., by activating switch S3 or switch S4). While the control module 411 is illustrated in FIG. 4 as being included in the circuit diagram 400, the control module 411 may be implemented in other portions of the SNS 208 or DDFA 200. For example, a central control module may be configured to control all of the integrators 212. Control signals for activating/deactivating switches are understood by people having ordinary skill in the art and, thus, are not illustrated in FIG. 4 to avoid cluttering the circuit diagram 400.

For certain aspects, the comparator threshold may be set at 90% or 95% of the power supply voltage, for example. In this case, the amplifier (e.g., the DDFA 200) may also monitor the power supply voltage(s).

The performance protection circuitry may be capable of performing a soft reset or a hard reset of the integrator. In the case of a soft reset, a resistor (e.g., resistor R2) may be selectively connected in parallel with the integrating capacitor(s) C1 and C2, (e.g., by closing switch S3). FIG. 5A is a graph 500 of an example soft reset of an analog integrator with performance protection circuitry, in accordance with certain aspects of the present disclosure. As a result of the soft reset, the slope of the audio output signal may be decreased (i.e., the integrator is slowed down) until the integrator output goes below the threshold. FIG. 5A illustrates the effect of this soft reset for two different thresholds: Threshold 1 and Threshold 2, where Threshold 1 is higher than Threshold 2. The soft reset prevents the audio output signal from being railed at the power supply voltage.

In the case of a hard reset, a switch (e.g., switch S4) may be closed across the capacitor(s) (e.g., capacitor C1 and/or C2), thereby discharging the capacitor(s), shorting the integrator output (e.g., output node 405 or 405') to the amplifier input (e.g., input 412 or 412'), and completely resetting the integrator. FIG. 5B is a graph 520 of an example hard reset of an analog integrator with performance protection circuitry, in accordance with certain aspects of the present disclosure. The hard reset may entail more time for the entire loop to recover than the soft reset. FIG. 5B illustrates the effect of this hard reset for Threshold 1 and Threshold 2. The hard reset also prevents the audio output signal from being railed at the power supply voltage, but may take longer to recover from relative to a soft reset, as illustrated by comparing FIGS. 5A and 5B.

For certain aspects, multiple integrators may be reset concurrently, while in other aspects, different integrators or groups of integrators may be reset sequentially. Resetting all of the integrators may still cause temporary instability, however. For certain aspects, a subset of the integrators may be reset. For example, a majority or all but one of the integrators may be reset (e.g., the last integrator in the series of integrators 212 may not be reset). By allowing the final integrator to hold its value, the amplifier can resume operation much more smoothly, improving performance. In this manner, the SNR of the amplifier may increase from about 60-65 dB to approximately 85-90 dB. For certain aspects, the last integrator may be reset after all the other integrators are (concurrently) reset. As another example, all but the first and last integrators (e.g., in the series of integrators 212) may be reset. In this example, the first and last integrators may be reset after the other integrators are (concurrently) reset. In this case, the first and last integrators may be subsequently reset either concurrently or sequentially with respect to one another. Resetting an integrator may be considered as modifying a mode of the integrator, whereas allowing an integrator to hold its value may be considered as maintaining a mode of the integrator.

Although certain aspects of the present disclosure are described above as being applied in an audio amplifier, certain aspects may alternatively be applied in any of various suitable circuits, such as in a delta-sigma modulator.

Figure 6:
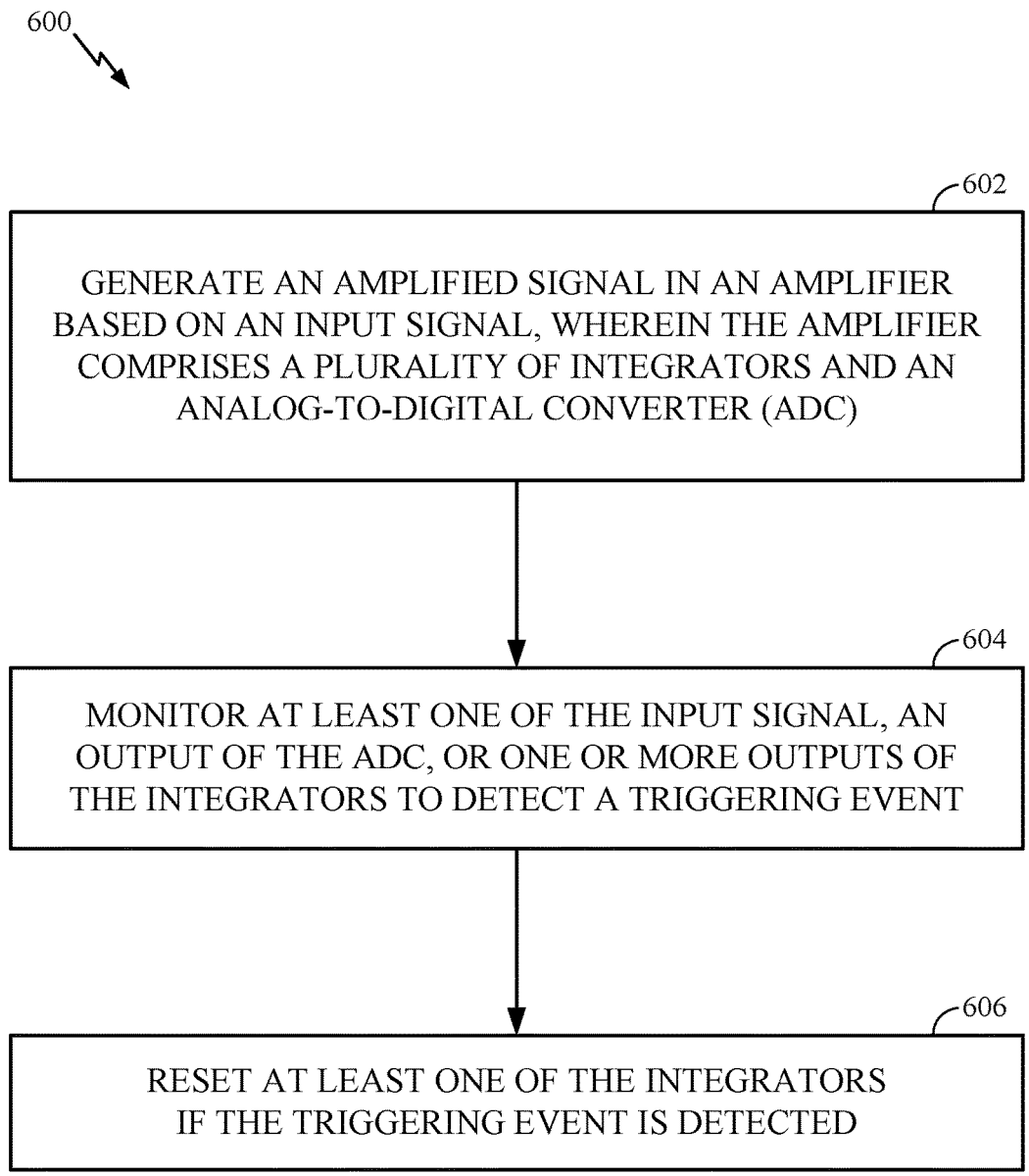
FIG. 6 is a flow diagram of example operations for operating an amplifier, in accordance with certain aspects of the present disclosure.

FIG. 6 is a flow diagram of example operations 600 for operating an amplifier, in accordance with certain aspects of the present disclosure. The operations 600 may be performed, for example, by a circuit, such as the class-D amplifier 100 of FIG. 1A, the class-D amplifier 150 of FIG. 1B, or the DDFA 200 of FIG. 2A.

The operations 600 may begin, at block 602, with the circuit generating an amplified signal in the amplifier based on an input signal. The amplifier includes a plurality of integrators (e.g., integrators 212) and an analog-to-digital converter (ADC) (e.g., ADC 216).

At block 604, the circuit may monitor at least one of the input signal (e.g., Audio Data), an output of the ADC (e.g., SNS Output), or one or more outputs of the integrators to detect a triggering event. For certain aspects, the monitoring at block 604 involves comparing an output of one of the integrators with a threshold. In this case, the triggering event may include the output of the one of the integrators being greater than the threshold. For certain aspects, the monitoring at block 604 entails comparing the input signal, the output of the ADC, or an output of one of the integrators with a threshold. In this case, the triggering event may include the input signal, the output of the ADC, or the output of the one of the integrators being greater than the threshold. According to certain aspects, the triggering event comprises the output of the ADC being saturated.

At block 606, the circuit may reset (e.g., modify a mode of) at least one of the integrators if the triggering event is detected. The resetting at block 606 may involve resetting all but one of the integrators. For certain aspects, the plurality of integrators are arranged in a series. In this case, the one integrator may be the last integrator in the series (e.g., the mode of the last integrator is maintained). The resetting at block 606 may involve resetting a majority of the plurality of integrators. For certain aspects, the resetting at block 606 entails closing a switch (e.g., S4) connected in parallel with a capacitor (e.g., C1 or C2) of the at least one of the integrators to discharge the capacitor. For certain aspects, the resetting at block 606 includes closing a switch (e.g., S3) to connect a resistor (e.g., R2) in parallel with a capacitor (e.g., C1 or C2) of the at least one of the integrators.

Certain aspects of the present disclosure provide an amplifier. The amplifier generally includes an output stage configured to generate an amplified signal, wherein the output stage is driven based on an input signal, a feedback network connected with the output stage and comprising a delta-sigma modulator with a plurality of integrators and an ADC, and logic. The logic is configured to monitor at least one of the input signal, an output of the ADC, or one or more outputs of the integrators to detect a triggering event, and to reset at least one of the integrators if the triggering event is detected.

According to certain aspects, the logic is configured to reset the at least one of the integrators by resetting all but one of the integrators.

According to certain aspects, the logic is configured to reset the at least one of the integrators by closing a switch connected in parallel with a capacitor of the at least one of the integrators.

According to certain aspects, the logic is configured to reset the at least one of the integrators by closing a switch to connect a resistor in parallel with a capacitor of the at least one of the integrators.

According to certain aspects, the amplifier further includes a comparator configured to compare an output of one of the integrators with a threshold. In this case, the triggering event may include the output of the one of the integrators being greater than the threshold.

According to certain aspects, the logic is configured to monitor the at least one of the input signal, the output of the ADC, or the one or more outputs of the integrators by comparing the input signal, the output of the ADC, or an output of one of the integrators with a threshold. In this case, the triggering event may include the input signal, the output of the ADC, or the output of the one of the integrators being greater than the threshold.

According to certain aspects, the triggering event involves the output of the ADC being saturated.

Certain aspects of the present disclosure provide a method for operating an amplifier comprising a plurality of integrators. The method generally includes generating an amplified signal in the amplifier based on an input signal; monitoring one or more of the input signal, an output of an ADC of the amplifier, and one or more outputs of the integrators to detect a triggering event; and resetting a subset of the plurality of integrators if the triggering event is detected.

According to certain aspects, the subset includes a majority of the plurality of integrators.

According to certain aspects, the subset includes all but one of the integrators. For certain aspects, the plurality of integrators are arranged in a series, and the one integrator is a last integrator in the series.

Example Direct Digital Feedback Amplifier Features

Analog class-D amplifiers provide high efficiency output stages (>90%), but still involve significant analog circuitry and allow limited digital processing. Certain aspects of the present disclosure provide a direct digital feedback amplifier (DDFA) (e.g., the DDFA 200 of FIG. 2A). With the extensive digital processing offered by the DDFA, additional amplifier features may be provided including active protection management, BTL versus SE operation, DC offset calibration due to off-chip component mismatch, and dynamic overload management.

The DDFA 200 may support an internal BTL power amplifier (PA) configuration, an external BTL PA configuration, or an external SE PA configuration. External dead time control may be supported for increased PA efficiency. For certain aspects, an optional power supply unit analog-to-digital converter (PSUADC) 230 in the DDFA 200 may ensure feed-forward power delivery independent of the power supply voltage, as illustrated in FIG. 2A.

Furthermore, the DDFA 200 may support either or both AD BTL modulation and BD BTL modulation. For certain aspects, the DDFA 200 may support the capability of switching back and forth between AD and BD BTL modulation schemes. AD modulation may have large differential content with no significant common-mode content, while BD modulation may have large common-mode content. BD modulation may be used in an "LC filter"-less operation implementation, in which the LPF 108 is removed and the load is driven directly by the output stage 106, relying on the impedance of the load to filter the output audio signal.

Figure 7:
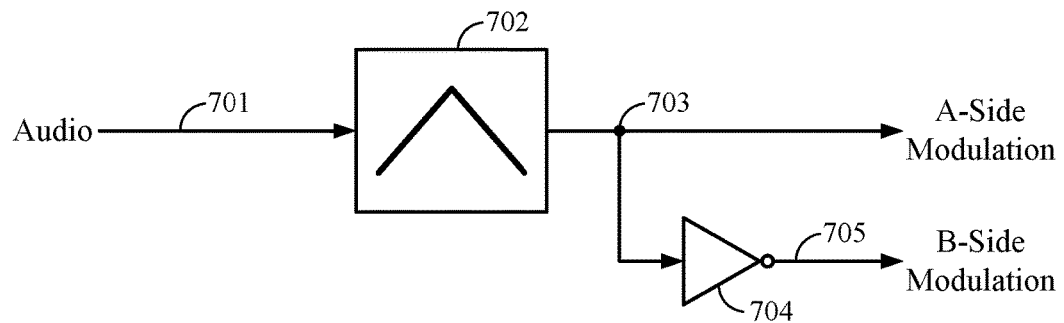
FIG. 7 is a block diagram of AD BTL modulation, in accordance with certain aspects of the present disclosure.

AD modulation may entail driving each driver 104 (A side versus B side) inversely, as illustrated in FIG. 7. With AD modulation, the modulated signal takes only two values (e.g., plus/minus supply voltages), and thus, AD modulation is also referred to as "binary modulation" or "two-level modulation." In FIG. 7, an input audio signal 701 is modulated (e.g., pulse width modulated) by a modulator 702 (e.g., the pulse width modulator 202) to produce a modulated signal 703 for the A-side modulation. The modulated signal 703 is also input to an inverter 704 to produce an inverted modulated signal 705 for the B-side modulation.

Figure 8:
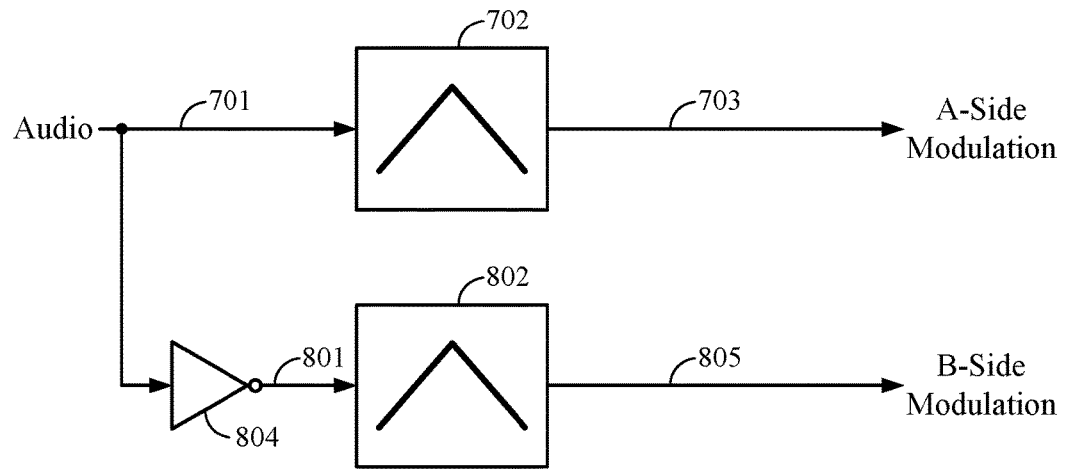
FIG. 8 is a block diagram of BD BTL modulation, in accordance with certain aspects of the present disclosure.

BD Modulation may involve inverting the audio signal to compare against the triangle wave for the B side of modulation, as illustrated in FIG. 8. In BD modulation, the modulated signal takes three different values (e.g., plus/minus supply voltages and ground), so BD modulation is also referred to as "ternary modulation" or "three-level modulation." In FIG. 8, the input audio signal 701 is modulated by the modulator 702 to produce the modulated signal 703 for the A-side modulation, similar to FIG. 7. However, the input audio signal 701 is input to an inverter 804 to produce an inverted input signal 801. This inverted input signal 801 is modulated by a modulator 802 (e.g., the pulse width modulator 202) to produce another modulated signal 805 for the B-side modulation.

Figure 9:
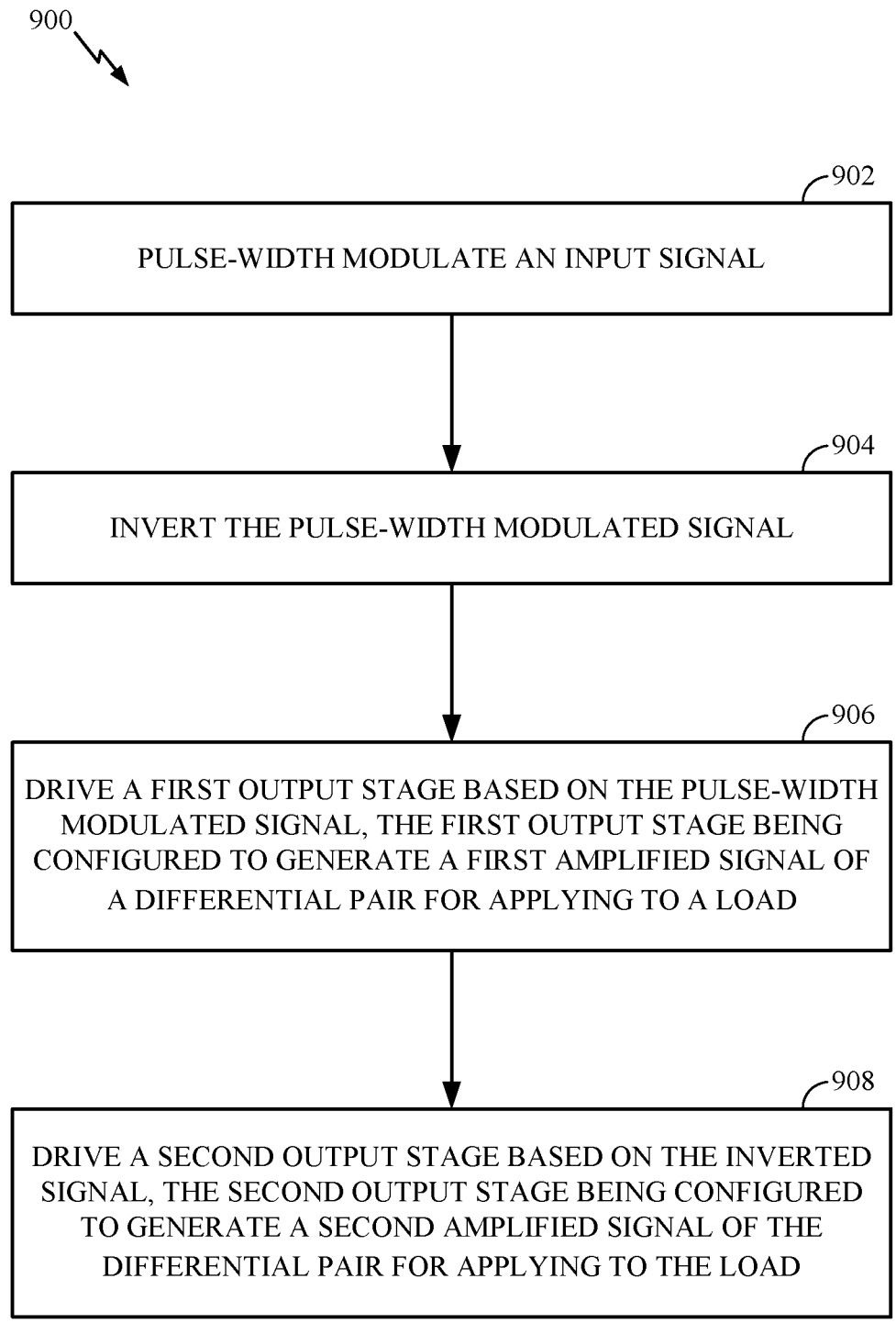
FIG. 9 is a flow diagram of example operations for operating an amplifier using AD BTL modulation, in accordance with certain aspects of the present disclosure.

FIG. 9 is a flow diagram of example operations 900 for operating an amplifier using AD BTL modulation, in accordance with certain aspects of the present disclosure. The operations 900 may be performed, for example, by a circuit, such as the DDFA 200 of FIG. 2A, implemented as illustrated in FIG. 7. For certain aspects, the amplifier may comprise a class-D amplifier.

The operations 900 may begin, at block 902, with the circuit pulse-width modulating an input signal. At block 904, the circuit may invert the pulse-width modulated signal. At block 906, the circuit may drive a first output stage based on the pulse-width modulated signal, where the first output stage is configured to generate a first amplified signal of a differential pair for applying to a load. At block 908, the circuit may drive a second output stage based on the inverted signal, where the second output stage is configured to generate a second amplified signal of the differential pair for applying to the load.

According to certain aspects, pulse-width modulating the input signal at block 902 may involve comparing the input signal to a triangle wave.

According to certain aspects, the circuit may switch to another mode. In this case, the operations 900 may include pulse-width modulating the input signal, inverting the input signal, and pulse-width modulating the inverted input signal. For certain aspects, the operations 900 may further include driving the first output stage based on the pulse-width modulated input signal and driving the second output stage based on the pulse-width modulated inverted signal.

Figure 10:
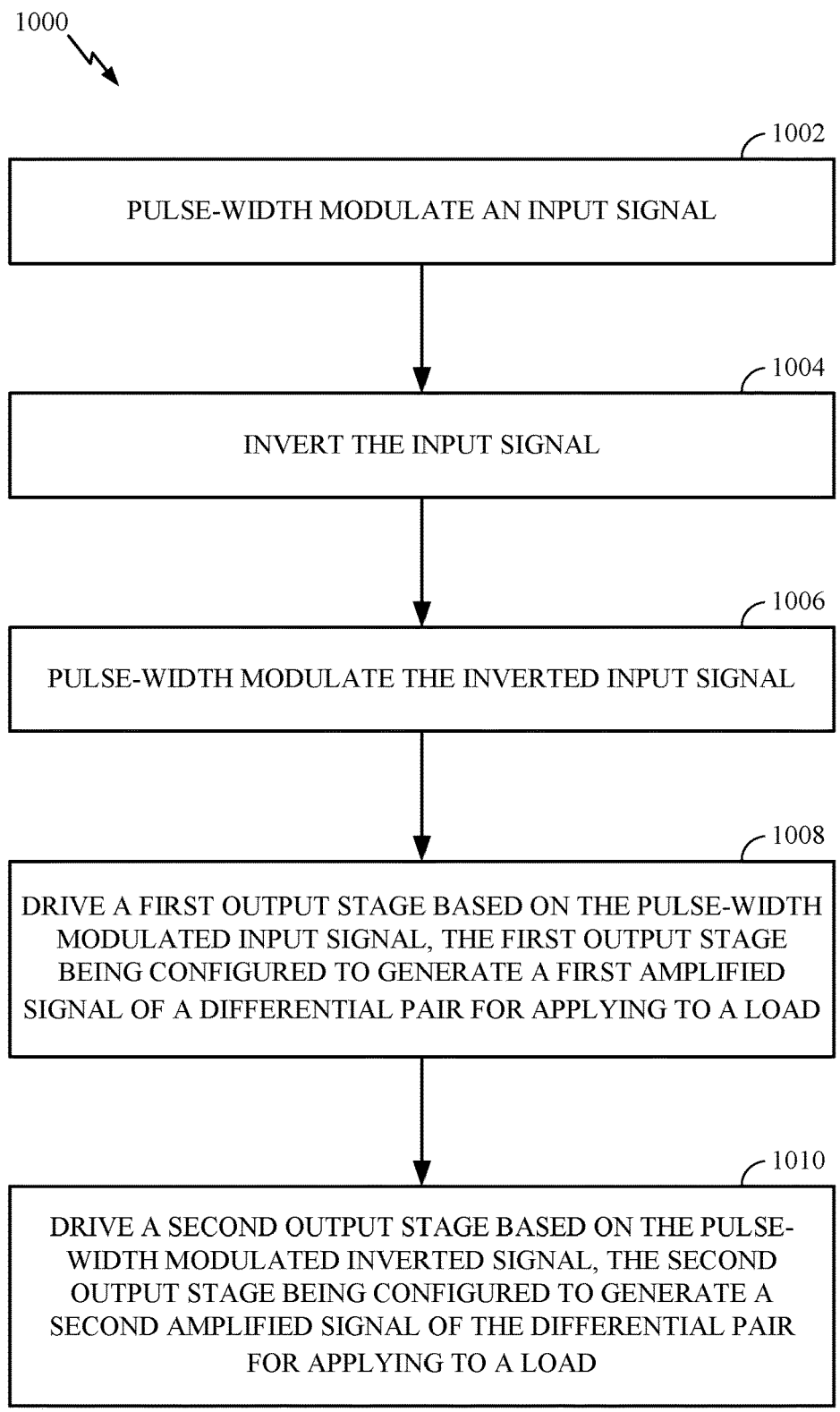
FIG. 10 is a flow diagram of example operations for operating an amplifier using BD BTL modulation, in accordance with certain aspects of the present disclosure.

FIG. 10 is a flow diagram of example operations 1000 for operating an amplifier using BD BTL modulation, in accordance with certain aspects of the present disclosure. The operations 1000 may be performed, for example, by a circuit, such as the DDFA 200 of FIG. 2A, implemented as illustrated in FIG. 8. For certain aspects, the amplifier may comprise a class-D amplifier.

The operations 1000 may begin, at block 1002, with the circuit pulse-width modulating an input signal. At block 1004, the circuit may invert the input signal, and at block 1006, the circuit may pulse-width modulate the inverted input signal. At block 1008, the circuit may drive a first output stage based on the pulse-width modulated input signal, where the first output stage is configured to generate a first amplified signal of a differential pair for applying to a load. At block 1010, the circuit may drive a second output stage based on the pulse-width modulated inverted signal, where the second output stage is configured to generate a second amplified signal of the differential pair for applying to the load.

According to certain aspects, pulse-width modulating the input signal at block 1002 may entail comparing the input signal to a first triangle wave. Pulse-width modulating the inverted input signal at block 1006 may involve comparing the inverted input signal to a second triangle wave.

According to certain aspects, the circuit may switch to another mode. In this case, the operations 1000 may include pulse-width modulating the input signal and inverting the pulse-width modulated signal. For certain aspects, the operations 1000 may further include driving the first output stage based on the pulse-width modulated signal and driving the second output stage based on the inverted pulse-width modulated signal.

Certain aspects of the present disclosure provide an amplifier (e.g., a class-D amplifier). The amplifier generally includes a pulse-width modulator configured to pulse-width modulate a digital input signal and to invert the pulse-width modulated signal; a first output stage configured to generate a first amplified signal of a differential pair for applying to a load, wherein the first output stage is driven based on the pulse-width modulated signal; and a second output stage configured to generate a second amplified signal of the differential pair for applying to the load, wherein the second output stage is driven based on the inverted signal.

According to certain aspects, the pulse-width modulator is configured to pulse-width modulate the digital input signal by comparing the digital input signal to a triangle wave.

Certain aspects of the present disclosure provide an amplifier (e.g., a class-D amplifier). The amplifier generally includes a pulse-width modulator configured to pulse-width modulate a digital input signal, to invert the digital input signal, and to pulse-width modulate the inverted input signal; a first output stage configured to generate a first amplified signal of a differential pair for applying to a load, wherein the first output stage is driven based on the pulse-width modulated input signal; and a second output stage configured to generate a second amplified signal of the differential pair for applying to the load, wherein the second output stage is driven based on the pulse-width modulated inverted signal.

According to certain aspects, the pulse-width modulator is configured to pulse-width modulate the digital input signal by comparing the digital input signal to a first triangle wave. For certain aspects, the pulse-width modulator is configured to pulse-width modulate the inverted input signal by comparing the inverted input signal to a second triangle wave.

Example Signal-Processing-Based Short Circuit Protection

Certain high power class-D audio amplifiers, especially discrete device power amplifiers (PAs) capable of delivering high currents, have architectures making it difficult to detect dangerous high current situations (e.g., during a short circuit between the speaker wires or between one of the speaker wires and electrical ground). For some circuits, very low impedance resistors are used to measure current. This may have disadvantages depending on how the short circuit occurs and involve an additional component in the bill of materials (BOM).

Certain techniques and apparatus described herein may protect the amplifier from dangerous high current situations. Certain aspects may be implemented so as to be agnostic with respect to how the short circuit occurs and/or without additional cost.

In a closed-loop pulse-width modulated class-D power amplifier (PA) (e.g., the class-D amplifiers 100, 150 or the DDFA 200), a feedback path (e.g., the feedback network 110) may correct for the noise and distortion introduced by the pulse-width modulation (PWM) and the quantization of the PA. Under normal conditions (e.g., constant power supply, normal load conditions) the feedback, when low-pass filtered, will have a nominal magnitude. When a short circuit occurs, the feedback may change its behavior as the amplifier circuit tries to correct (or at least adjust) for the larger drop across the PA. Certain aspects of the present disclosure detect and utilize this change in feedback to trigger a shutdown event to protect the PA from the short circuit.

Figure 2B:
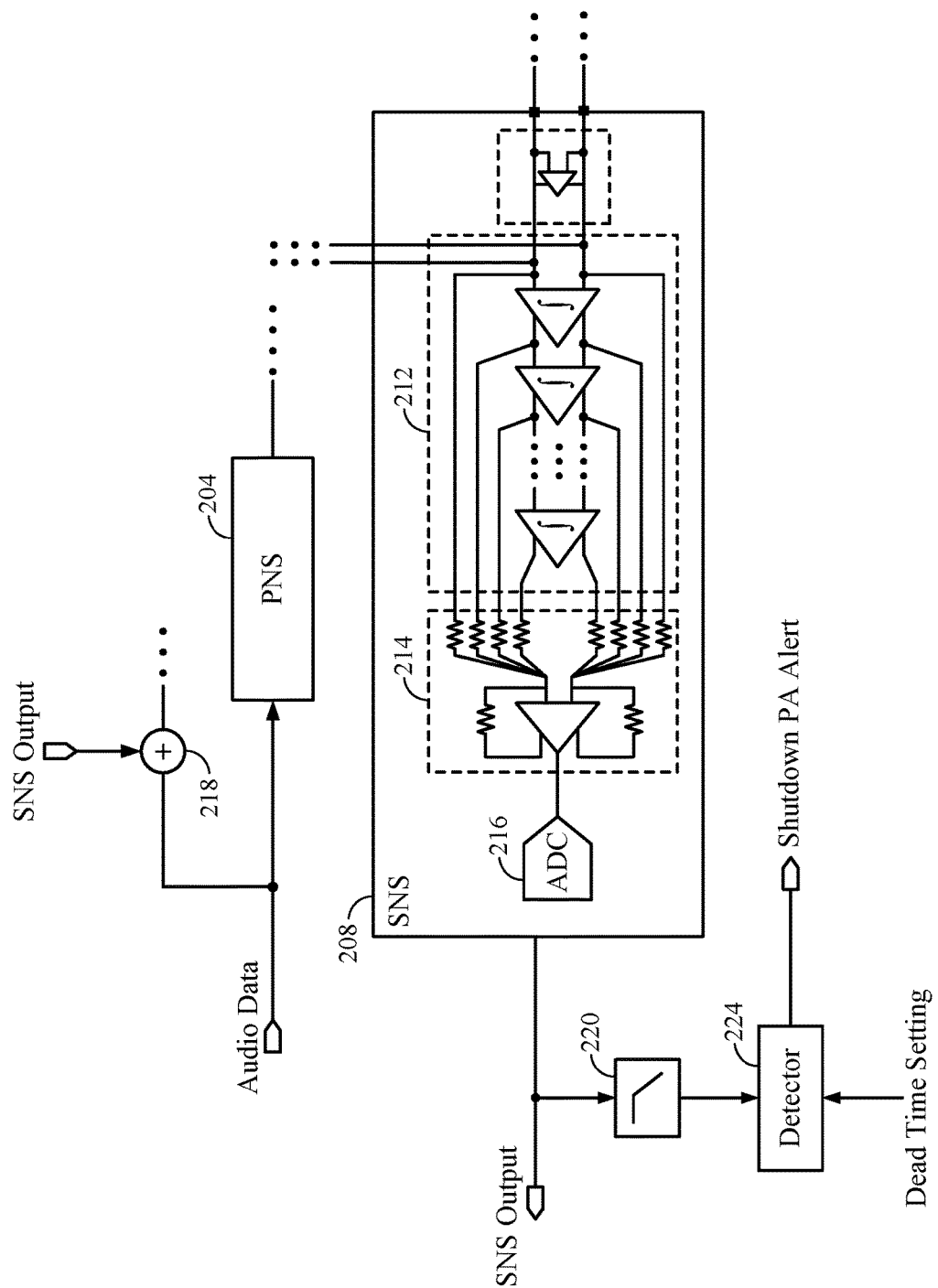
FIG. 2B is a block diagram of an example circuit for signal-processing-based protection from a short circuit, added to the DDFA of FIG. 2A, in accordance with certain aspects of the present disclosure.

For example, the DDFA 200 may include a digital low-pass filter (LPF) 220 and a digital detector 224, as illustrated in FIG. 2B. If the digital feedback signal (the SNS Output) output from the ADC 216 and filtered by the LPF 220 is greater than a threshold as determined by the detector 224, the detector may output a trigger (e.g., "Shutdown PA Alert") to shut down and protect the PA. For certain aspects, the trigger may be sent to the pulse width modulator 202 to temporarily cease outputting signals to drive the output stage 106.

When the supply is fluctuating, the feedback may correct for this fluctuation, causing deviations from the nominal response. However, if the power supply is used to modulate the PWM output such that the feed-forward energy delivered to the load (e.g., the speaker 112) is constant relative to the power supply, the feedback response may be independent of the supply changes, allowing this protection mechanism to function as desired.

Dead time between turning on the transistors in the output stage 106 may change the behavior of the feedback. Therefore, in amplifier circuits where the dead time may be changed dynamically, the feedback detection may be adjusted accordingly, altering the threshold according to the changes of the dead time. For certain aspects, for example, the detector 224 is configured to receive a dead time setting for adjusting the threshold for detecting an abnormal feedback response (i.e., the feedback detection threshold is a function of the dead time).

Figure 11:
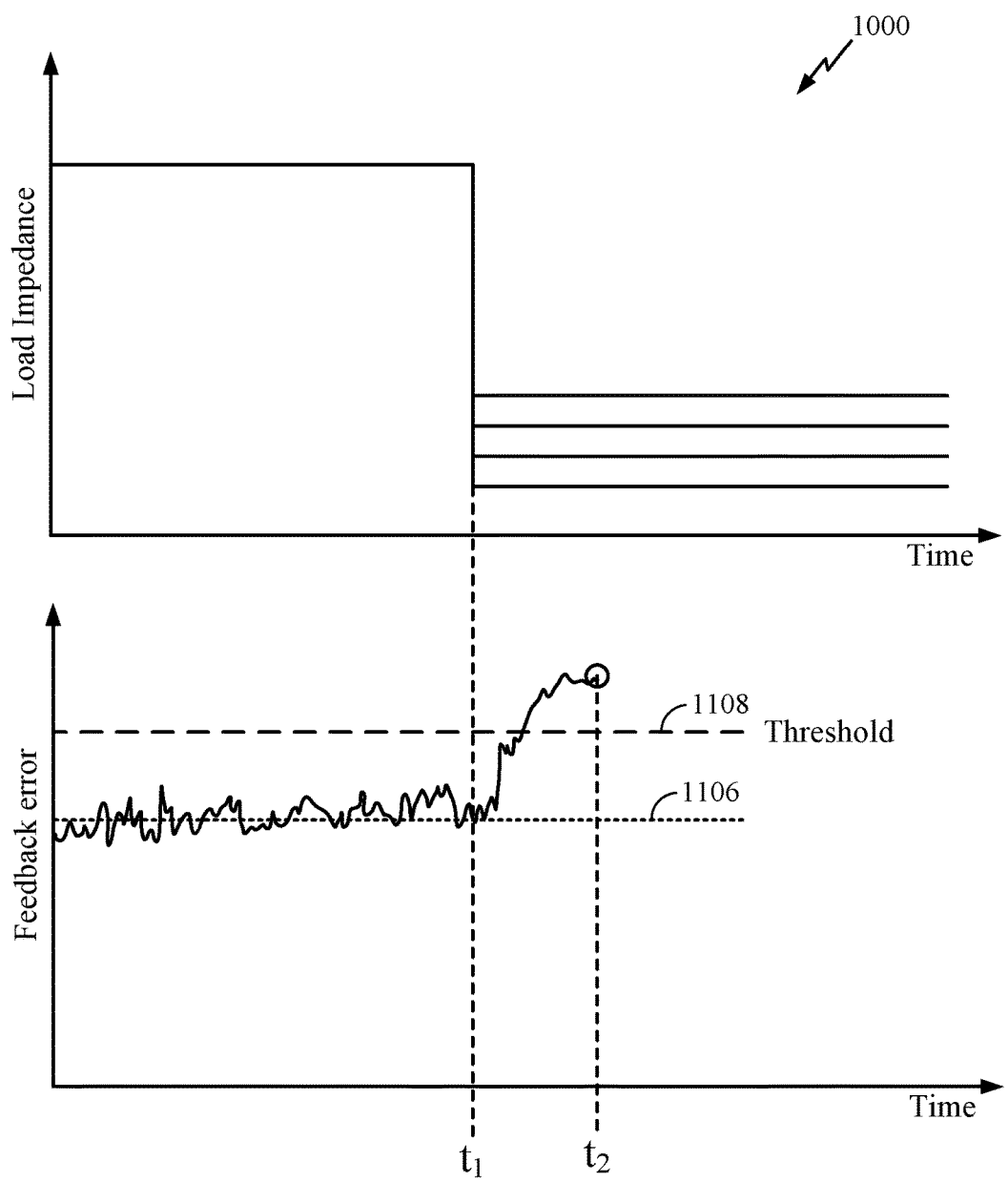
FIG. 11 illustrates the feedback response with time before and after the occurrence of a short circuit, in accordance with certain aspects of the present disclosure.

FIG. 11 illustrates a plot 1100 of the load impedance and the feedback response with time before and after the occurrence of a short circuit, in accordance with certain aspects of the present disclosure. Before the short circuit occurs at $t_1$, the load impedance may be in a range of 4 to 16Ω, for example, and the feedback response has a nominal average magnitude 1106. At the time of the short circuit ($t_1$), the load impedance (e.g., as seen by the output stage 106) drops (e.g., to less than 1Ω), which may draw excessive current from the power supply rails and could potentially start a fire. However, because the feedback response rises above a threshold 1108—sufficiently above the normal feedback response magnitude—a trigger is output at the time of detection ($t_2$) to shut down the PA and protect the circuit. The time between the short circuit occurring ($t_1$) and the time of detection ($t_2$) may be less than 200 μs, for example.

Figure 12:
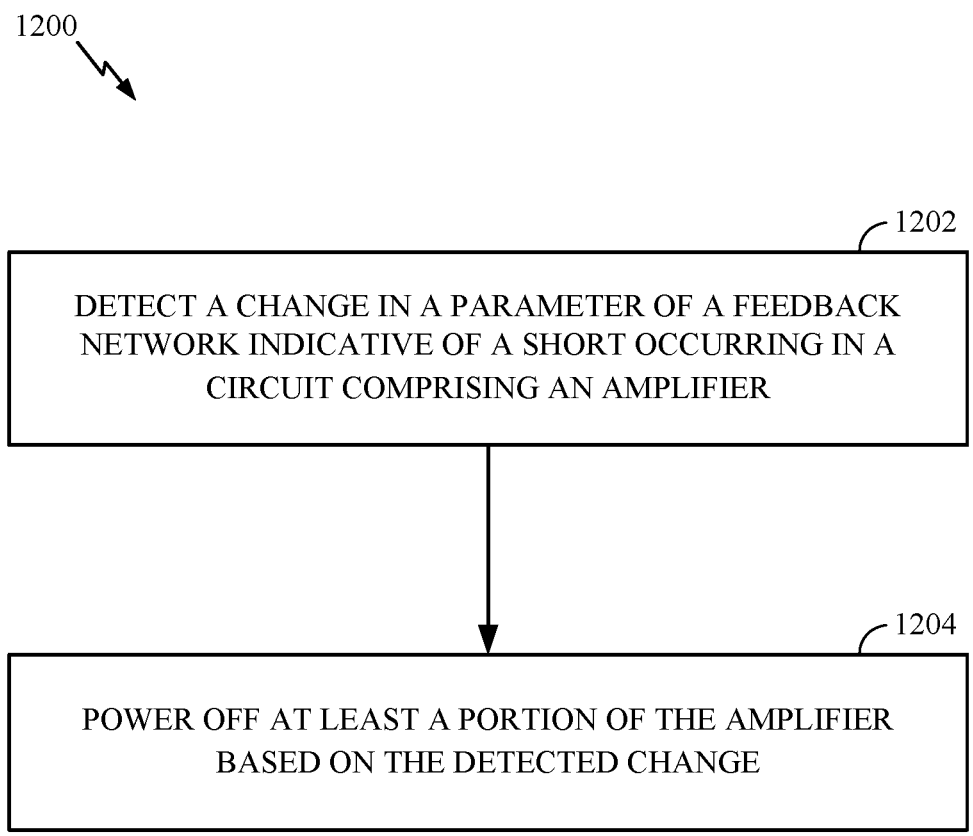
FIG. 12 is a flow diagram of example operations for protecting an amplifier having a feedback network, in accordance with certain aspects of the present disclosure.

FIG. 12 is a flow diagram of example operations 1200 for protecting an amplifier having a feedback network (e.g., feedback network 110), in accordance with certain aspects of the present disclosure. The operations 1200 may be performed, for example, by a circuit, such as the DDFA 200 of FIG. 2A or FIG. 2B.

The operations 1200 may begin, at block 1202, with the circuit detecting a change in a parameter of the feedback network (e.g., including the SNS 208) indicative of a short occurring in a circuit comprising the amplifier. At block 1204, the circuit may power off at least a portion of the amplifier based on the detected change from block 1202. According to certain aspects, the at least the portion of the amplifier includes an output stage of the amplifier (e.g., output stage 106), which may include a plurality of field-effect transistors (FETs).

According to certain aspects, the parameter comprises an amplitude of a signal in the feedback network.

According to certain aspects, the parameter comprises a first derivative of an amplitude of a signal in the feedback network.

According to certain aspects, the feedback network may include a resistor divider (e.g., voltage divider stage 210), one or more integrators (e.g., integrator 212), a summer (e.g., summation circuit 214), and an analog-to-digital converter (ADC) (e.g., ADC 216). In this case, the signal in the feedback network may include a digital output signal of the ADC. For certain aspects, the detecting at block 1202 involves low-pass filtering (e.g., with LPF 220) the digital output signal of the ADC and comparing an amplitude of the digital output signal to a threshold (e.g., threshold 1108), wherein the at least the portion of the amplifier is powered off if the amplitude of the digital output signal is greater than the threshold. For certain aspects, the operations 1200 may further entail the circuit adjusting a dead time for FETs in an output stage of the amplifier and altering the threshold for the detection based on the dead time. For certain aspects, the operations 1200 may further include the circuit comparing a first derivative of the amplitude of the digital output signal to another threshold, wherein the at least the portion of the amplifier is powered off if the amplitude of the digital output signal is greater than the threshold and if the first derivative of the amplitude of the digital output signal is greater than the other threshold.

In other aspects, a value or error from one or more of the integrators 212 may be monitored using a method or elements other than described above, and the portion of the amplifier may be powered off based on a detected change in the value or error from the one or more of the integrators 212. In some aspects, an expected value is established (a prior value or a value based on a monitoring of the integrators 212), and the portion is powered off when the value or error is detected to be outside of a threshold with respect to the expected value.

According to certain aspects, the short occurs between speaker wires. The speaker wires may be connected between the amplifier and a speaker driven by the amplifier.

According to certain aspects, the short occurs between a speaker wire and a reference potential (e.g., an electrical ground) connected between the amplifier and a speaker driven by the amplifier.

According to certain aspects, a period between a time of the short occurring and a time of the change being detected is less than 200 μs.

According to certain aspects, a response of the feedback network is independent of changes in a power supply voltage for powering an output stage of the amplifier.

According to certain aspects, the feedback network includes an active analog feedback network.

Certain aspects of the present disclosure provide methods and apparatus for protecting an audio amplifier having a feedback network, using digital signal processing. One example amplifier generally includes an output stage configured to generate an amplified signal; a feedback network connected with the output stage and configured to generate a feedback signal, based on the amplified signal, for comparison with an input signal for the amplifier; and a protection circuit connected with the feedback network and configured to detect a change in a parameter of the feedback network indicative of a short occurring in a circuit comprising the amplifier and to control powering off at least a portion of the amplifier based on the detected change.

According to certain aspects, the amplifier is a class-D amplifier.

According to certain aspects, the parameter includes an amplitude of the feedback signal generated by the feedback network.

According to certain aspects, the parameter includes a first derivative of an amplitude of the feedback signal generated by the feedback network.

According to certain aspects, the feedback network includes a resistor divider for dividing down the amplified signal, one or more integrators, a summer, and an analog-to-digital converter (ADC). In this case, the feedback signal may be a digital output signal of the ADC. For certain aspects, the protection circuit includes a low-pass filter configured to low-pass filter the digital output signal of the ADC and a comparator configured to compare an amplitude of the digital output signal to a threshold. The comparator may be configured to generate a control signal to power off the at least the portion of the amplifier if the amplitude of the digital output signal is greater than the threshold. For certain aspects, the output stage includes a plurality of FETs driven to generate the amplified signal. In this case, the threshold may be based on a dead time for the FETs. For certain aspects, the amplifier further includes another comparator configured to compare a first derivative of the amplitude of the digital output signal to another threshold. In this case, the other comparator may be configured to generate another control signal to power off the at least the portion of the amplifier if the first derivative of the amplitude of the digital output signal is greater than the other threshold.

According to certain aspects, the output stage includes a plurality of FETs driven to generate the amplified signal. For certain aspects, the at least the portion of the amplifier includes the FETs.

According to certain aspects, the short occurs between speaker wires connected with the output stage or between one of the speaker wires and another point electrically coupled to the amplifier.

According to certain aspects, a period between a time of the short occurring and a time of the change being detected by the protection circuit is less than 200 µs.

According to certain aspects, a response of the feedback network is independent of changes in a power supply voltage for powering the output stage of the amplifier.

According to certain aspects, the feedback network comprises an active analog feedback network.

Example High Amplitude Performance in Delta-Sigma Modulators

When a high amplitude signal is injected into a feedback system such as a delta-sigma modulator, the system itself can become unstable or experience reduced performance due to a lack of headroom for the feedback to perform its intended impact. For example, the PNS 204 may be designed to operate at 0 dBFS. However, the feedback nature of the delta-sigma modulator in the PNS 204 may operate with some headroom in order to provide feedback, which may not be possible when a 0 dBFS signal is provided.

Certain aspects of the present disclosure provide techniques and apparatus that maintain performance or increase the likelihood of performance being maintained for the amplifier when input signals exceed the headroom. To ensure performance, certain aspects of the present disclosure provide different modes of operation to reduce the PNS coefficients (e.g., make them less aggressive) and allow for stability as the input exceeds a threshold. For certain aspects, the threshold may be programmable. The modes may use a noise shaper that shapes the difference between the programmed threshold and the input signal.

Figure 13:
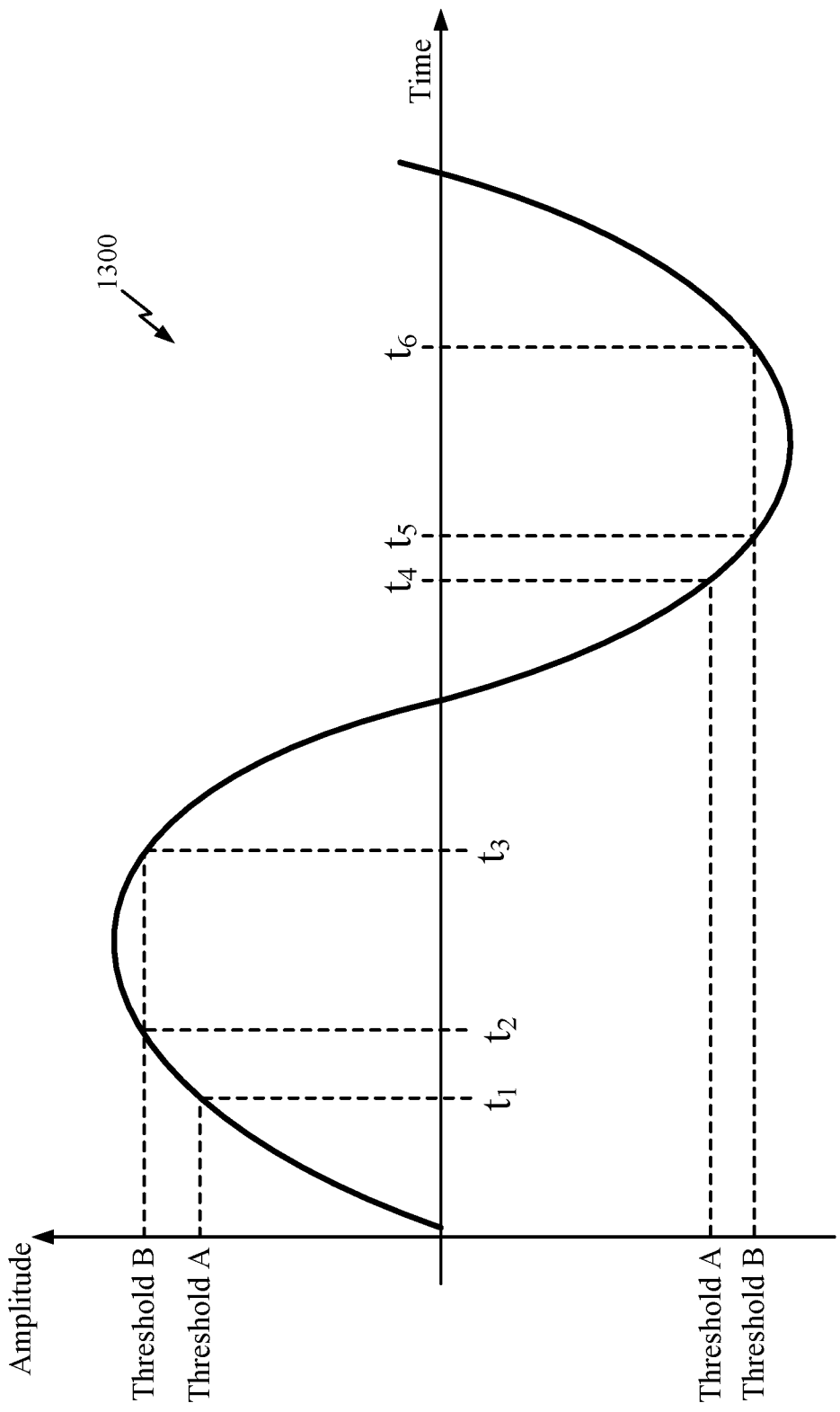
FIG. 13 illustrates different thresholds being applied to higher amplitudes of an example input signal, in accordance with certain aspects of the present disclosure.

FIG. 13 is a graph 1300 illustrating the amplitude of an example audio input signal with time, which may represent a digital audio input signal. When the input audio signal exceeds Threshold A at $t_1$, the PNS 204 may begin to modulate the integrator enable signals. The higher the input signal gets, the less average time the integrators in the PNS 204 are on, effectively shifting the poles of the delta-sigma modulator. When the input signal exceeds a larger threshold (Threshold B) at $t_2$, the PNS 204 may enter into a fixed $n^{th}$-order mode of operation (e.g., a $2^{nd}$-order mode) in which n integrators in the delta-sigma modulator are enabled. As the input signal drops below Threshold B at $t_3$, the PNS 204 may resume its normal mode of operation (with all integrators in the delta-sigma modulator enabled). In this manner, the PNS 204 may maintain performance of the amplifier when the input signal exceeds the headroom for feedback in the delta-sigma modulator.

Likewise, when the input audio signal goes more negative than Threshold A at $t_4$, the PNS 204 may begin to modulate the integrator enable signals. The more negative the input signal gets, the less average time the integrators in the PNS 204 are on, effectively shifting the poles of the delta-sigma modulator. When the input signal goes more negative than Threshold B at $t_5$, the PNS 204 may enter into a fixed $n^{th}$-order mode of operation (e.g., a $2^{nd}$-order mode). As the input signal rises above Threshold B at $t_6$, the PNS 204 may resume its normal mode of operation.

Figure 14:
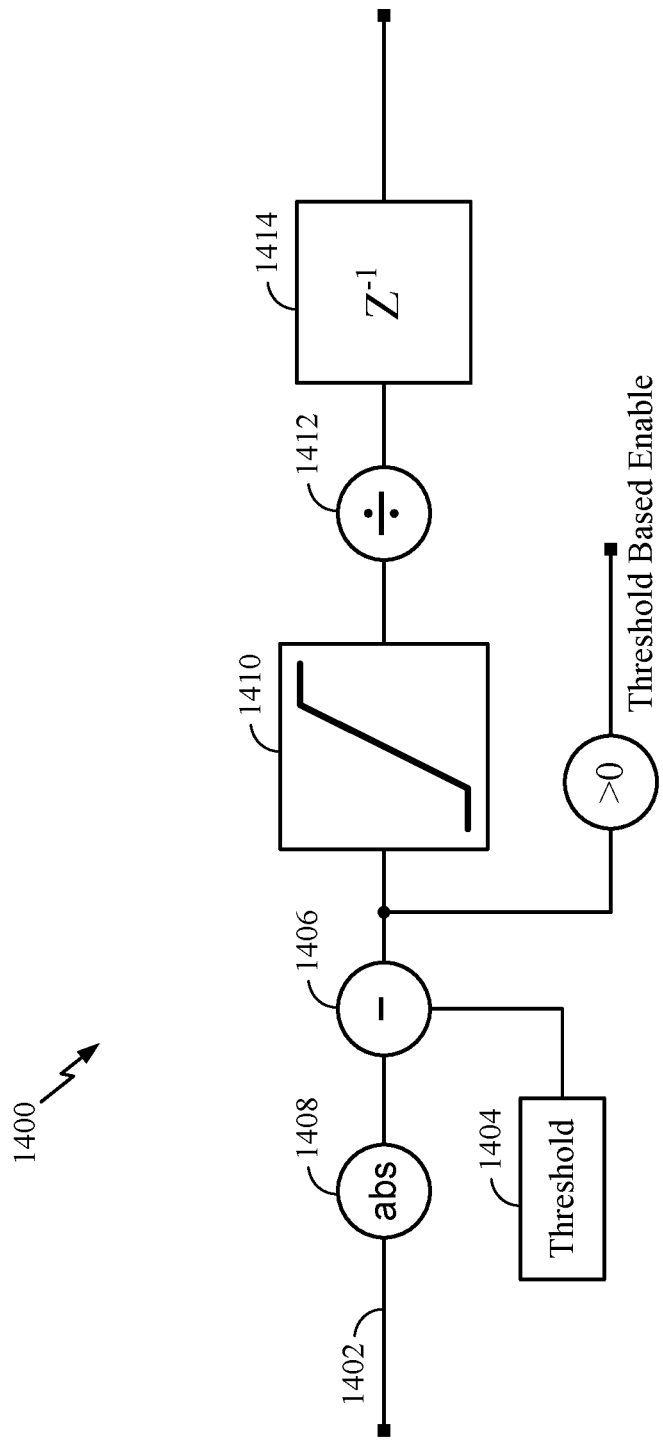
FIG. 14 is a block diagram of example primary noise shaper (PNS) modulation control, in accordance with certain aspects of the present disclosure.
Figure 15:
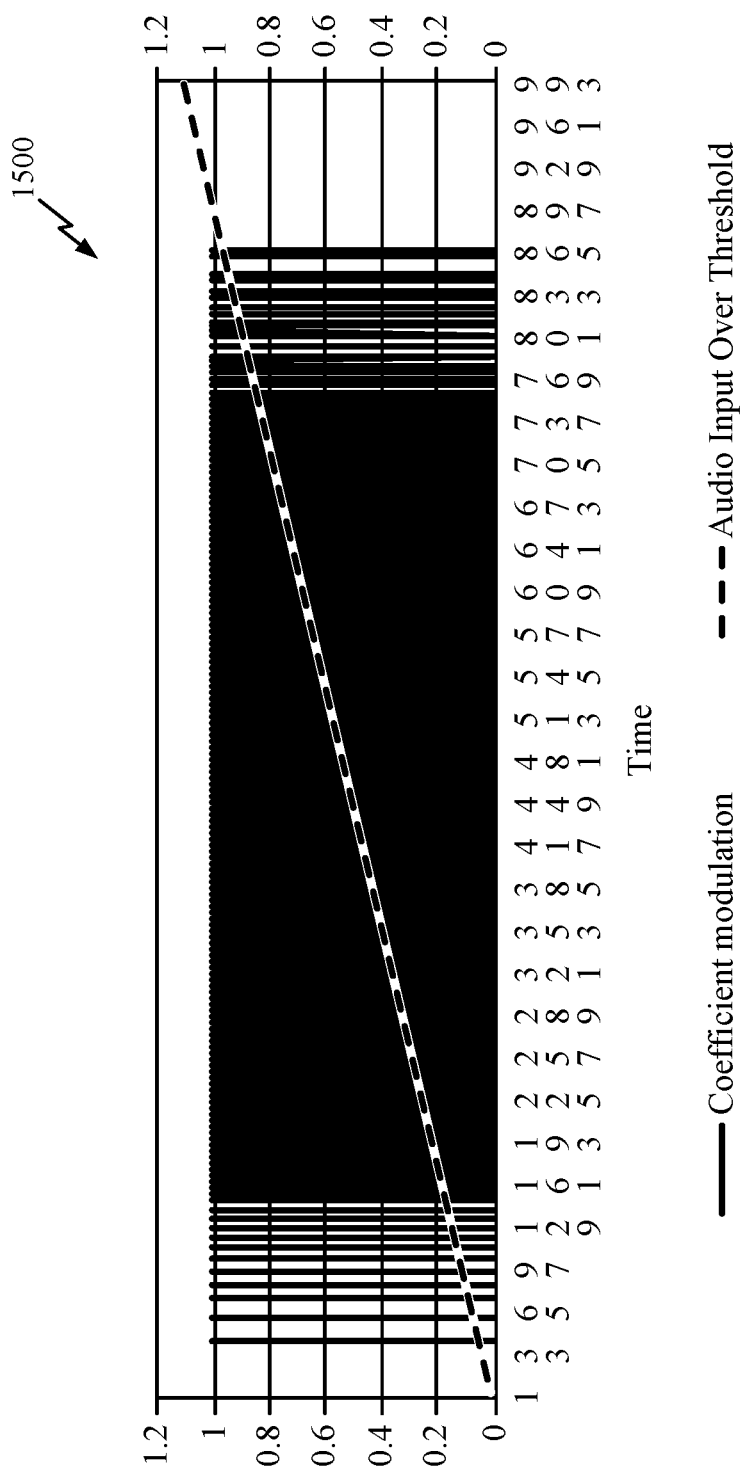
FIG. 15 illustrates example PNS coefficient modulation, in accordance with certain aspects of the present disclosure.

To ensure stability and performance for large magnitude signals (e.g., signal levels >−0.5 dBFS) the system may be designed to modulate (enable/disable) the coefficients of the delta-sigma modulator. This PNS modulation control is illustrated in the block diagram 1400 of FIG. 14, and the coefficient modulation with time is illustrated in the plot 1500 of FIG. 15. The first step may be to determine when the input 1402 is over the programmed threshold 1404 by taking the absolute value of the input 1402 at 1408 and calculating the difference therebetween with a subtractor 1406. For certain aspects, saturation block 1410 may prevent overflow and underflow. For certain aspects, the output of the saturation block 1410 may be effectively divided by a divider 1412 (e.g., using a logic shift) and then integrated using an integrator 1414, which may include noise-shaping capabilities. The integrator 1414 may provide reduced quantization noise without increasing datapath bandwidth. If the input threshold difference is small, then the integrator overflow may be less frequent, thus less frequently disabling the integrators in the PNS 204. When the input threshold difference is large, the integrator 1414 may overflow more frequently, therefore more frequently disabling the integrators in the PNS 204. The plot 1500 of FIG. 15 illustrates that as the amplitude of the signal 1502 increases, the duty cycle of the coefficient modulation enable decreases until this duty cycle is 0%.

While this block may begin this noise shaping when the input exceeds the threshold, the coefficient modulation signal may be blocked until certain circumstances are met. Each mode may define its own conditions. Examples of conditions used to trigger this behavior may include threshold-based modulation and saturation-based modulation.

Threshold-based modulation uses the input threshold difference to enable the outputs. Threshold-based modulation does not take into account any integrator saturation status, meaning if one of the integrators becomes saturated without exceeding this threshold, this method will not engage. Saturation-based modulation uses the saturation of any of the integrators to enable the modulation of the coefficients. The benefit of saturation-based modulation is that this scheme will not reduce performance preemptively.

Figure 16:
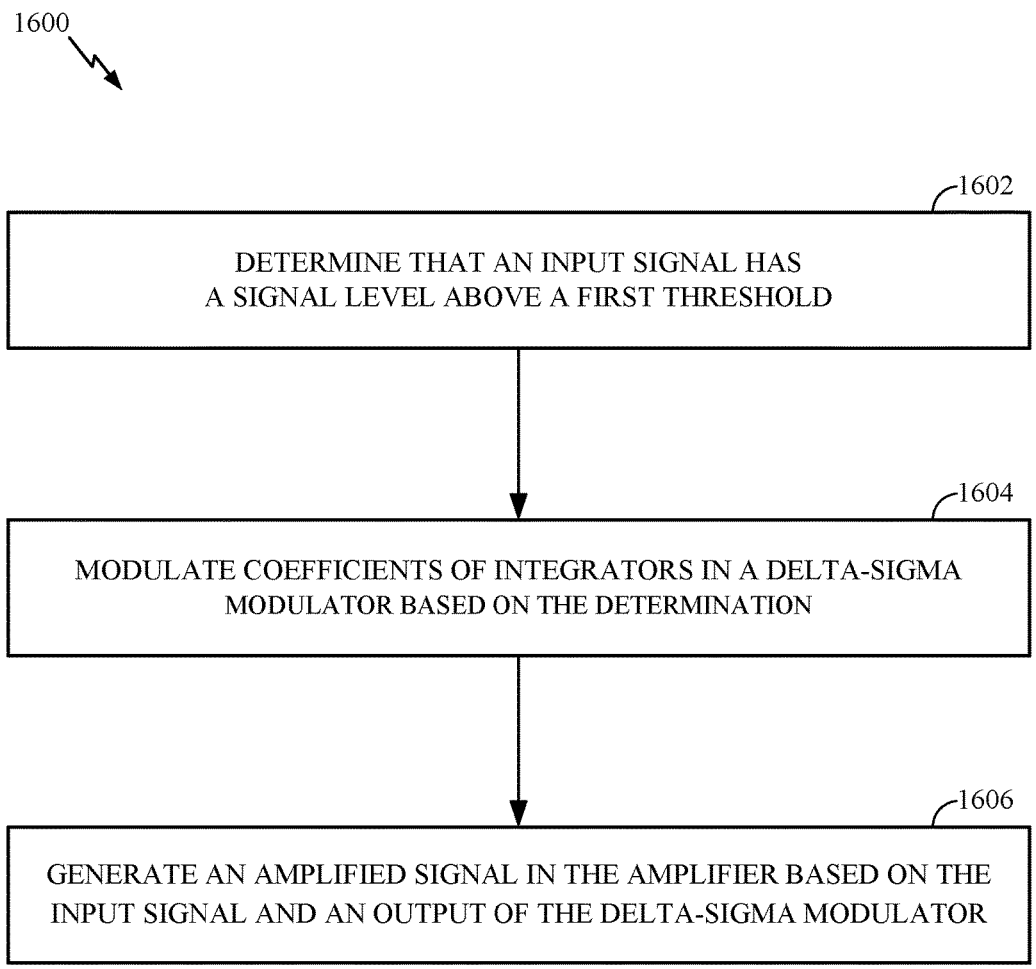
FIG. 16 is a flow diagram of example operations for operating an amplifier, in accordance with certain aspects of the present disclosure.

FIG. 16 is a flow diagram of example operations 1600 for operating an amplifier, in accordance with certain aspects of the present disclosure. The operations 1600 may be performed, for example, by a circuit, such as the DDFA 200 of FIG. 2A.

The operations 1600 may begin, at block 1602, with the circuit determining that an input signal (e.g., a digital input signal) has a signal level above a first threshold. At block 1604, the circuit may modulate coefficients of integrators in a delta-sigma modulator based on the determination. For certain aspects, the modulating at block 1604 involves enabling a set of the integrators and disabling a different set of the integrators in the delta-sigma modulator. At block 1606, the circuit may generate an amplified signal in the amplifier based on the input signal and an output of the delta-sigma modulator.

According to certain aspects, the operations 1600 may further include the circuit converting a digital output of the delta-sigma modulator to an analog signal and combining the analog signal with a feedback signal in a feedback network of the amplifier. In this case, the amplified signal is generated based on the input signal and the combined signal.

According to certain aspects, the operations 1600 may further entail the circuit determining that the signal level of the input signal is above a second threshold, the second threshold being greater than the first threshold and operating the delta-sigma modulator in a fixed second-order mode of operation based on the signal level being above the second threshold. For certain aspects, the operations 1600 may further include the circuit determining, after operating the delta-sigma modulator in the fixed second-order mode of operation, that the signal level of the input signal is below the second threshold; and operating the delta-sigma modulator in a normal mode of operation based on the signal level being below the second threshold.

According to certain aspects, the amplifier comprises a class-D amplifier.

Certain aspects of the present disclosure provide methods and apparatus for preventing instability when operating a delta-sigma modulator with a high amplitude input signal in an amplifier with a feedback network. One example method for operating an amplifier generally includes determining that an input signal has a signal level above a first threshold, modulating coefficients of integrators in a delta-sigma modulator based on the determination, and generating an amplified signal in the amplifier based on the input signal and an output of the delta-sigma modulator.

Certain aspects of the present disclosure provide an amplifier. The amplifier generally includes an integrator comprising at least three integrator stages coupled in series and control circuitry coupled to the integrator and configured to maintain a mode of a first or a last integrator stage of the at least three integrator stages and to modify a mode of at least one intermediate integrator stage of the at least three integrator stages while maintaining the mode of the first or the last integrator stage.

According to certain aspects, the at least three integrator stages include five integrator stages. In this case, the control circuitry may be configured to modify modes of three intermediate integrator stages of the five integrator stages.

According to certain aspects, the control circuitry is configured to modify the mode of the at least one intermediate integrator stage by discharging a capacitive element in a feedback network of the at least one intermediate integrator stage.

According to certain aspects, the control circuitry is configured to modify the mode of the at least one intermediate integrator stage by connecting a resistive element in parallel with a capacitive element in a feedback network of the at least one intermediate integrator stage.

According to certain aspects, the control circuitry is configured to maintain the mode of the last integrator stage and to modify the mode of the first integrator stage.

According to certain aspects, the amplifier further includes an output stage comprising a plurality of transistors connected in a push-pull configuration and a feedback network having an input coupled to the output stage and comprising the integrator. For certain aspects, the control circuitry is configured to modify the mode of the at least one intermediate integrator stage by resetting the at least one intermediate integrator stage based on a variation in at least one of an input signal for the amplifier, an output signal of the feedback network, or one or more output signals of the at least three integrator stages. For certain aspects, the input signal is an audio input signal.

According to certain aspects, the integrator comprises a digital integrator (e.g., in a digital delta-sigma modulator). In this case, the control circuitry may be configured to modify the mode of the at least one intermediate integrator stage by modulating one or more coefficients for the at least one intermediate integrator stage. For certain aspects, the control circuitry is configured to modulate the one or more coefficients for the at least one intermediate integrator stage when an input signal for the amplifier exceeds a threshold.

The various operations or methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for generating a drive signal may include a modulator (e.g., the PWM and error amplifier stage 102 illustrated in FIG. 1A or 1B or the pulse width modulator 202 depicted in FIG. 2A). Means for switching may include a switching circuit, which may be implemented by one or more transistors (e.g., the transistors in the output stage 106 shown in FIG. 1A, 1B, or 2). Means for amplifying a signal may include an amplifier (e.g., the class-D amplifiers 100, 150 portrayed in FIGS. 1A and 1B or the DDFA 200 illustrated in FIG. 2A), and more specifically, an output power stage (e.g., the output stage 106 depicted in FIG. 1A, 1B, or 2A) and a driving circuit for driving the output power stage (e.g., drivers 104 shown in FIG. 1A or 1B).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An amplifier comprising:
an integrator comprising at least three integrator stages coupled in series; and
control circuitry coupled to the integrator and configured to maintain a mode of a first or a last integrator stage of the at least three integrator stages and to modify a mode of at least one intermediate integrator stage of the at least three integrator stages while maintaining the mode of the first or the last integrator stage, wherein the control circuitry is configured to modify the mode of the at least one intermediate integrator stage by discharging a capacitive element in a feedback network of the at least one intermediate integrator stage.

2. The amplifier of claim 1, further comprising:
an output stage comprising a plurality of transistors connected in a push-pull configuration, wherein the feedback network has an input coupled to the output stage and comprising the integrator.

3. The amplifier of claim 2, wherein the control circuitry is further configured to modify the mode of the at least one intermediate integrator stage by resetting the at least one intermediate integrator stage based on a variation in at least one of an input signal for the amplifier, an output signal of the feedback network, or one or more output signals of the at least three integrator stages.

4. The amplifier of claim 3, wherein the input signal comprises an audio input signal.

5. The amplifier of claim 1, wherein the at least three integrator stages comprise five integrator stages and wherein the control circuitry is configured to modify modes of three intermediate integrator stages of the five integrator stages.

6. The amplifier of claim 1, wherein the control circuitry is configured to modify the mode of the at least one intermediate integrator stage by connecting a resistive element in parallel with another capacitive element in the feedback network of the at least one intermediate integrator stage.

7. The amplifier of claim 1, wherein the control circuitry is configured to maintain the mode of the last integrator stage and to modify the mode of the first integrator stage.

8. The amplifier of claim 1, wherein the integrator comprises a digital integrator and wherein the control circuitry is further configured to modify the mode of the at least one intermediate integrator stage by modulating one or more coefficients for the at least one intermediate integrator stage.

9. A method of operating an amplifier comprising a plurality of integrators and an analog-to-digital converter (ADC), comprising:
generating an amplified signal in the amplifier based on an input signal; and
resetting at least one of the integrators based on a variation in at least one of the input signal, an output of the ADC, or one or more outputs of the integrators, wherein the resetting comprises closing a switch connected in parallel with a capacitive element of the at least one of the integrators to discharge the capacitive element.

10. The method of claim 9, wherein the resetting comprises resetting all but one of the integrators.

11. The method of claim 10, wherein the plurality of integrators are arranged in a series and wherein the one integrator is a last integrator in the series.

12. The method of claim 9, wherein the resetting comprises closing a switch to connect a resistive element in parallel with another capacitive element of the at least one of the integrators.

13. The method of claim 9, further comprising comparing the input signal, the output of the ADC, or an output of one of the integrators with a threshold, wherein the resetting is based on the input signal, the output of the ADC, or the output of the one of the integrators being greater than the threshold.

14. The method of claim 9, wherein the resetting is based on the output of the ADC being saturated.

15. The method of claim 9, wherein the amplifier comprises a direct digital feedback amplifier.

16. An amplifier comprising:
    an output stage comprising a plurality of transistors; and
    a feedback network having an input coupled to an output of the output stage and comprising a plurality of integrators connected in series, wherein at least one of the plurality of integrators comprises:
        an operational amplifier having an input and an output;
        a first resistive element coupled to the input of the operational amplifier;
        a first capacitive element coupled between the input and the output of the operational amplifier; and
        a first switch coupled between the input and the output of the operational amplifier, wherein a first terminal of the first switch is coupled to the input of the operational amplifier, and a second terminal of the first switch is coupled to the output of the operational amplifier.

17. The amplifier of claim 16, wherein the at least one of the integrators further comprises a second switch connected in series with a second resistive element and wherein the second switch and the second resistive element are coupled between the input and the output of the operational amplifier.

18. The amplifier of claim 16, wherein the at least one of the integrators further comprises a second capacitive element connected in series with a second switch and wherein the second capacitive element and the second switch are coupled between the input and the output of the operational amplifier.

19. The amplifier of claim 16, further comprising one or more comparators, wherein at least one of the comparators has a first input coupled to the output of the operational amplifier and a second input coupled to a threshold voltage source.

20. The amplifier of claim 16, wherein the feedback network further comprises:
    a summation circuit having an input coupled to one or more outputs of the plurality of integrators; and
    an analog-to-digital converter (ADC) having an input coupled to an output of the summation circuit.

21. The amplifier of claim 20, further comprising circuitry configured to:
    monitor at least one of an input signal for the amplifier, an output of the ADC, or one or more outputs of the plurality of integrators to detect a triggering event; and
    reset one or more of the plurality of integrators if the triggering event is detected.

22. The amplifier of claim 21, wherein the circuitry is configured to reset the one or more of the plurality of integrators by resetting all but one of the plurality of integrators.

23. The amplifier of claim 21, further comprising a comparator configured to compare an output of one of the plurality of integrators with a threshold, wherein the triggering event comprises the output of the one of the plurality of integrators being greater than the threshold.

24. The amplifier of claim 21, wherein the circuitry is configured to monitor the at least one of the input signal, the output of the ADC, or the one or more outputs of the plurality of integrators by comparing the input signal, the output of the ADC, or an output of one of the plurality of integrators with a threshold and wherein the triggering event comprises the input signal, the output of the ADC, or the output of the one of the plurality of integrators being greater than the threshold.

25. The amplifier of claim 21, wherein the triggering event comprises the output of the ADC being saturated.

26. The amplifier of claim 16, wherein the amplifier comprises a direct digital feedback amplifier and wherein the feedback network comprises a delta-sigma modulator comprising the plurality of integrators.

27. The amplifier of claim 16, further comprising:
    a combiner coupled to an input node for receiving an input signal for the amplifier and to an output of the feedback network; and
    a modulator having an input coupled to an output of the combiner and having an output coupled to an input of the output stage.

* * * * *